United States Patent [19]

Aoai et al.

[11] Patent Number: 5,824,451
[45] Date of Patent: Oct. 20, 1998

[54] POSITIVE PHOTOSENSITIVE COMPOSITION

[75] Inventors: Toshiaki Aoai; Tsukasa Yamanaka, both of Shizuoka, Japan

[73] Assignee: Fuji Photo Film Co., Ltd., Kanagawa, Japan

[21] Appl. No.: 497,795

[22] Filed: Jul. 3, 1995

[30] Foreign Application Priority Data

Jul. 4, 1994 [JP] Japan .................................. 6-152218
Jul. 8, 1994 [JP] Japan .................................. 6-157278
Jul. 12, 1994 [JP] Japan .................................. 6-160143

[51] Int. Cl.$^6$ ..................................................... G03F 7/004
[52] U.S. Cl. ......................... 430/270.1; 430/326; 430/905
[58] Field of Search ................................. 430/270, 326, 430/905

[56] References Cited

U.S. PATENT DOCUMENTS

| | | | |
|---|---|---|---|
| 5,035,979 | 7/1991 | Nguyen-Kim et al. | 430/270.1 |
| 5,332,648 | 7/1994 | Kihara et al. | 430/326 |
| 5,342,727 | 8/1994 | Vicari et al. | 430/270.1 |
| 5,352,564 | 10/1994 | Takeda et al. | 430/270.1 |
| 5,580,702 | 12/1996 | Hayase et al. | 430/270.1 |

FOREIGN PATENT DOCUMENTS

| | | |
|---|---|---|
| 249139 | 12/1987 | European Pat. Off. . |
| 424124 | 4/1991 | European Pat. Off. . |
| 541112 | 5/1993 | European Pat. Off. . |
| 569707 | 11/1993 | European Pat. Off. . |

OTHER PUBLICATIONS

M. Padmanaban, et al., "Structure–Property Relationship in Acetal–Based Chemically Amplified Three Component DUV Resist", SPIE vol. 2195, pp. 61–73.

*Primary Examiner*—John S. Chu
*Attorney, Agent, or Firm*—Sughrue, Mion, Zinn, Macpeak & Seas, PLLC

[57] ABSTRACT

A positive photosensitive composition comprising (a) a resin soluble in an aqueous alkali solution containing a specific structure unit; (b) a compound which generates an acid with irradiation of an active ray or radiation; and (c) a low molecular weight acid-decomposable dissolution inhibitor having a molecular weight of not more than 3000, which possesses a tertiary alkyl ester group and whose solubility in an aqueous alkali solution is increased by the action of an acid; wherein compound (c) is a compound having at least two tertiary alkyl ester groups, in which the longest distance with respect to the distance between two tertiary ester groups selected arbitrarily comprises at least 10 bonding atoms except for the atoms contained in the ester groups or a compound having at least three tertiary alkyl ester groups, in which the longest distance with respect to the distance between two tertiary ester groups selected arbitrarily comprises at least 9 bonding atoms except for the atoms contained in the ester groups. The positive photosensitive composition has a high sensitivity, high resolution and good profile and excels in storage stability and heat resistance of the resist solution.

20 Claims, No Drawings

POSITIVE PHOTOSENSITIVE COMPOSITION

FIELD OF THE INVENTION

This invention relates to a positive photosensitive composition for use in a stage for producing a semiconductor such as a lithographic plate and an IC, a production of a circuit substrate such as a liquid crystal and a thermal head, and any other photo-fabrication stage.

BACKGROUND OF THE INVENTION

A composition containing an alkali-soluble resin and a naphthoquinone diazide compound as a photosensitive substance has been generally used as a positive type photo-resist composition. For instance, U.S. Pat. Nos. 3,666,473, 4,115,128, and 4,173,470, etc. disclose "novolac type phenol resin/naphthoquinone diazide substituted compound" and L. F. Thompson discloses in "Introduction to Microlithography" (ACS Publisher, No. 2, Vol. 19, pp.112–121) discloses an example of "a novolac resin comprising cresol-formaldehyde/sulfonic ester of trihydroxybenzophenone-1, 2-naphthoquinone diazide" as the most typical composition.

In such a positive photo-resist basically comprising a novolac resin and a quinone diazide compound, the novolac resin provides high resistance to plasma edging and the naphthoquinone diazide acts as a dissolution inhibitor. In addition, the naphthoquinone diazide forms a carboxylic acid when undergoing a light irradiation, thereby losing the function of dissolving suppression, to enhance the alkali solubility of the novolac resin.

Up to date, various positive photo-resists containing a novolac resin and a naphthoquinone diazide photosensitive substance have been developed and put into a practical use from such a viewpoint, and they have sufficient results in a line width process of approximately 0.8 to 2 $\mu$m.

However, an integrated circuit increasingly has an enhanced integration degree, and in the production of a semiconductor substrate such as a super LSI, it has been required to process a super fine pattern comprising a line width of half micron or less. In order to attain the required resolution, a wavelength of the exposing machine used in a photographic lithography has become more small wavelength. At the present, the use of a far infrared ray or an excimer laser ray (e.g., XeCl, KrF, ArF, etc.) has been considered.

However, when the conventional resist comprising a novolac and a naphthoquinone diazide compound is used for the formation of a lithographic pattern with a far infrared ray or a excimer laser, since the novolac and the naphthoquinone diazide have strong absorptions at a far infrared region, the light is difficult to arrive at the bottom of the resist and, thus, only a low sensitive pattern having a taper can be obtained.

As one means for solving the problem, U.S. Pat. No. 4,491,628, European patent No. 249,139, etc. disclose chemically amplified resist compositions. The chemically amplified positive type resist composition is a pattern-forming material in which an acid is formed on an exposed portion with the irradiation such as far infrared ray, and the solubilities in a developer on the radiation-exposed portion and the unexposed portion are caused to be changed by a reaction with the aid of this acid, thereby forming a pattern on a substrate.

Examples which can be mentioned include a combination of a compound which generates an acid by photochemical decomposition with an acetal or O,N-acetal compound (JP-A-48-89003; the term "JP-A" as used herein means Japanese unexamined patent publication), a combination of a compound which generates an acid by photochemical decomposition with an ortho ester or amide ester compound (JP-A-51-120714), a combination of a compound which generates an acid by photochemical decomposition with a polymer having an acetal or ketal group in the main chain (JP-A-53-133429), a combination of a compound which generates an acid by photochemical decomposition with an enol ether (JP-A-55-12995), a combination of a compound which generates an acid by photochemical decomposition with an N-acylimino carbonic acid compound (JP-A-55-126236), a combination of a compound which generates an acid by photochemical decomposition with a polymer having an ortho ester group in the main chain (JP-A-56-17345), a combination of a compound which generates an acid by photochemical decomposition with a tertiary alkyl ester (JP-A-60-3625), a combination of a compound which generates an acid by photochemical decomposition with a silyl ester (JP-A-60-37549 and JP-A-60-121446), etc. Since the quantum yield exceeds 1 in principle they exhibit a high sensitivity.

Similarly, examples of the systems which are stable with the elapse of time at room temperature but which are decomposed by being heated in the presence of an acid to show an alkali-solubility include combinations of compounds which generate an acid by exposure with ester or carbonate compounds of a tertiary or secondary carbon (e.g., t-butyl or 2-cyclohexenyl), for example, as described in JP-A-59-45439, JP-A-60-3625, JP-A-62-229242, JP-A-63-27829, JP-A-63-36240, JP-A-63-250642, Polym. Eng. Sce. Vol. 23, p. 1012 (1983), ACS. Sym. Vol. 242, p. 11 (1984), Semiconductor World, November (1987), p. 91, Macromolecules, Vol. 21, p. 1475, (1988), and SPIE, Vol. 920, p. 42 (1988). These systems also possess high sensitivity and have a small absorption at a deep UV region in comparison with the naphthoquinone diazide/novolac resin; thus, they can be considered to be systems effective for shortening the wavelength of the light source described above.

The positive type chemically amplified resists described above can be roughly classified into three-component systems comprising an alkali soluble resin, a compound which generates an acid through exposure with irradiation (a photo-acid generator) and a dissolution inhibitive compound which becomes alkali-soluble by a catalytic reaction with an acid (an acid-decomposable dissolution inhibitor), and two-component systems comprising a resin possessing a group which becomes alkali-soluble by a reaction with an acid and a photo-acid generator.

In the two-component chemically amplified type positive resist (U.S. Pat. No. 4,491,628), the alkali-soluble group of the alkali-soluble binder is broken chiefly by an acid-decomposable group to decrease the alkali-solubility of the binder.

The acid-decomposable dissolution inhibitor of the three-component chemically amplified positive resist (European patent No. 249,139 and JP-A-2-248953) itself is insoluble in alkali, and plays a role in decreasing the alkali-solubility of the binder resin by an interaction with the binder resin.

As described above, it can be considered that the schemes of exhibiting the suppression of alkali-dissolving in the two-component systems and the three-component systems are different.

In the case of the two-component systems, since there is a large content of the acid-decomposable group in the resin, the resist film is undesirably shrunken by baking after the exposure.

The three-component systems have the problem that since the dissolving suppression against the alkali-soluble resin is insufficient, the film is excessively decreased during the course of developing so as to markedly deteriorate the resist profile.

However, the three-component systems are promising systems in terms of wide range of the selection of a material and, thus, it has been desired to develop an acid-decomposable compound excelling in dissolving suppression used in such systems.

For example, with regard to the performance of suppressing the alkali dissolving of the acid-decomposable dissolution inhibitor in the three-component chemically amplified positive resist, the performance is effectively exhibited as the proportion of the alkali-soluble group protected by the acid-decomposable group is higher. JP-A-2-248953 discloses an acid-decomposable dissolution inhibitor in which an alkali-soluble group (phenolic OH group) remains in the molecule, but its suppression of dissolving is weak, and the resolution and resist profile are also insufficient.

Depending on the type of the acid-decomposable group, there arises the problem that as the amount of the acid-decomposable group incorporated is higher, the solubility in a solvent in the course of the preparation of the resist solution is drastically decreased.

Moreover, JP-A-63-27829 and JP-A-3-198059 disclose dissolution inhibitor comprising naphthalene, biphenyl and a diphenylcycloalkane as skeleton compounds, but their suppression of dissolving is small and they are also insufficient in terms of the profile and resolution.

An object of the present invention is, therefore, to provide a three-component chemically amplified positive photosensitive composition having high sensitivity, high resolution, and good profile and free from separation with time elapse.

SUMMARY OF THE INVENTION

As a result of our study considering the above characteristics, it has been found that the object of the present invention can be achieved by using a positive photosensitive composition containing an alkali-soluble resin, a photo-acid generator and a dissolution inhibitive compound having an acid-decomposable group and satisfying the following requirements.

The present invention is, therefore, a positive photosensitive composition comprising:
(a) a resin insoluble in water and soluble in an aqueous alkali solution, the resin comprising a structure unit represented by formula (A) and at least one structure unit represented by formulae (B) to (E);
(b) a compound which generates an acid with irradiation of an active ray or radiation; and
(c) a low molecular weight acid-decomposable dissolution inhibitor having a molecular weight of not more than 3000, which possesses a tertiary alkyl ester group and whose solubility in an aqueous alkali solution is increased by the action of acid;
wherein compound (c) is at least one compound selected from the group consisting of
(i) a compound having at least two tertiary alkyl ester groups, in which the longest distance with respect to the distance between two tertiary ester groups selected arbitrarily comprises at least 10 bonding atoms except for the atoms contained in the ester groups, and
(ii) a compound having at least three tertiary alkyl ester groups, in which the longest distance with respect to the distance between two tertiary ester groups selected arbitrarily comprises at least 9 bonding atoms except for the atoms contained in the ester groups.

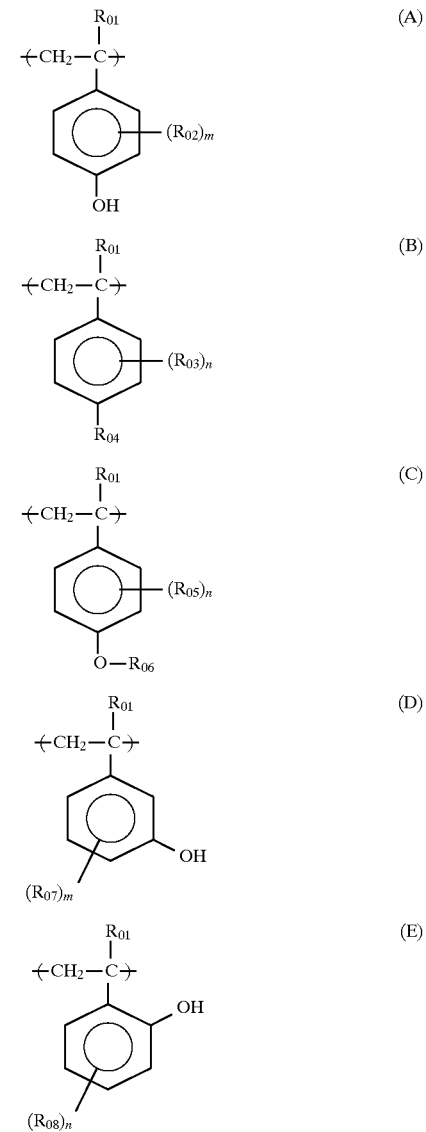

In the above formulae, $R_{01}$ represents a hydrogen atom or a methyl group;

$R_{02}$ each independently represents a hydrogen atom, an alkyl group which may possess a substituent, a cycloalkyl group which may possess a substituent, an alkoxy group which may possess a substituent, a hydroxy group, a cyano group, a nitro group, or a halogen atom, $R_{03}$ each independently represents a hydrogen atom, an alkyl group which may possess a substituent, a cycloalkyl group which may possess a substituent, an alkoxy group which may possess a substituent, a cyano group, a nitro group, or a halogen atom, $R_{04}$ represents a hydrogen atom, an alkyl group which may possess a substituent, a cycloalkyl group which may possess a substituent, an aryl group which may possess a substituent, a cyano group, a nitro group, or a halogen atom, $R_{05}$ each independently represents a hydrogen atom, an alkyl group which may possess a substituent, a cycloalkyl group which may possess a substituent, an alkoxy group which may possess a substituent, a hydroxy group, a cyano group, a nitro group, or a halogen atom, $R_{06}$ represents an alkyl group which may possess a substituent or an acyl group which may possess a substituent, $R_{07}$ and $R_{08}$ each independently represents a hydrogen atom, an alkyl group which may possess a substituent, a cycloalkyl group which may possess a substituent, an alkoxy group which may possess a substituent, a hydroxy group, a cyano group, a nitro group or a halogen atom, and m and n are independently 0 or an integer of from 1 to 3. A plurality of $R_{02}$, $R_{03}$, $R_{05}$, $R_{07}$ or $R_{08}$ may be the same or different.

DETAILED DESCRIPTION OF THE INVENTION

As the alkyl group, an alkyl group having 1 to 4 carbon atoms such as methyl, ethyl, propyl, n-butyl and t-butyl is preferable and a methyl group is more preferable. As the cycloalkyl group, a 5 to 7-membered cycloalkyl group such as cyclopentyl and cyclohexyl is preferable, and a cyclohexyl group is more preferable. As the alkoxy group, an alkoxy group having 1 to 4 carbon atoms such as methoxy, ethoxy, propoxy, n-butoxy and 2-methoxy-ethoxy is preferable, and a methoxy group, an ethoxy group, and a 2-methoxy-ethoxy group are more preferable. As the aryl group, an aryl group having 6 to 10 carbon atoms such as phenyl and tolyl is preferable and a phenyl group is more preferable. The halogen atom is a fluorine, chlorine, bromine or iodine atom, and a chlorine atom and a bromine atom are preferable. Preferred substituents include a hydroxy group, a cyano group, a phenyl group, a halogen atom such as those mentioned above, an alkyl group (preferably having 1 to 4 carbon atoms), and an alkoxy group (preferably having 2 to 4 carbon atoms). m and n independently are 0 or an integer of from 1 to 3, and preferably 0 or 1.

$R_{06}$ is an alkyl group which may possess a substituent or an acyl group which may possess a substituent. As the alkyl group, a primary alkyl group having 1 to 6 carbon atoms, such as methyl, ethyl, n-propyl, n-butyl and n-hexyl is preferable and a methyl group and an ethyl group are more preferable. As the acyl group, an acyl group having 1 to 8 carbon atoms such as acetyl, propanoyl, butanoyl and benzoyl is preferable, and an acetyl group and a propanoyl group are more preferable. Preferred substituents are a cyano group, the above-mentioned halogen atoms, a nitro group and an aryl group such as phenyl.

It has been found that in the three-component positive photosensitive material of the present invention when the acid-decomposable groups in the structure of the acid-decomposable dissolution inhibitor have a distance of a given value or more, the suppression of dissolving is drastically increased.

Moreover, when poly(p-hydroxystyrene) resin is used as the alkali-soluble resin, in spite of decreasing the efficiency for suppressing the dissolving due to its high dissolving rate as a rule, when it is combined with the above-mentioned acid-decomposable dissolution inhibitor, sufficient suppression of dissolving can be manifested. In addition, it has been found that when alkali-soluble resin (a) of the present invention is combined with the dissolution inhibitor (c) of the present invention, the effect is markedly enhanced.

Furthermore, since the alkali-soluble resin of the present invention has a small absorption at 248 nm in comparison with other alkali-soluble resins such as novolac resin, it does not undergo any filter effect during the exposure with a far ultraviolet ray and, thus, a pattern having better rectangle can be formed.

In the case of the combination with the alkali-soluble resin of the present invention, depending upon the type of the acid-decomposable group in the dissolution inhibitor, its heat decomposition temperature is drastically decreased. However, when a tertiary alkyl ester group is used as the acid-decomposable group, the heat decomposition temperature is maintained at a high degree (e.g., in the case of t-butyl ester: approximately 160° C.). A dissolution inhibitor having t-butyl ester group has good solubility in a resist solvent even if the amount of t-butyl ester group introduced is high.

The compounds used in the present invention will now be described in detail.

(A) Acid-decomposable dissolution inhibitive compound (Compound (c) of the present invention)

The acid-decomposable dissolution inhibitive compound (c) used in the present invention is a compound which possesses at least two tertiary ester groups in the structure thereof, and in which the longest distance with respect to the distance between two tertiary ester groups selected arbitrarily comprises at least 10, preferably at least 14, and more preferably at least 15, bonding atoms, or a compound which possesses at least three tertiary alkyl ester groups and in which the longest distance with respect to the distance between two tertiary ester groups selected arbitrarily is through at least 9, preferably at least 13, and more preferably at least 14, bonding atoms. The distance between two tertiary ester groups is represented by the number of the bonding atoms between the two tertiary ester groups (excluding the atoms contained in the tertiary ester groups) with respect to the shortest distance.

In the present invention, when the acid-decomposable dissolution inhibitor possesses at least three, preferably at least four, tertiary alkyl ester groups, or even when the acid-decomposable dissolution inhibitor possesses two tertiary alkyl ester groups, the dissolving suppression against the alkali-soluble resin is drastically enhanced in the case where the ester groups have at least given distance.

The distance between the ester groups in the present invention is expressed as a number of bonding atoms except for the ester groups. For example, in the case of the following compound (1), the distance between the ester groups is 8 bonding atoms, in the case of compound (2), the distance is 4 bonding atoms, and in the case of compound (3), the distance is 16 carbon atoms.

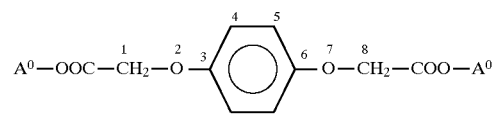

(1)

-continued

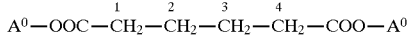

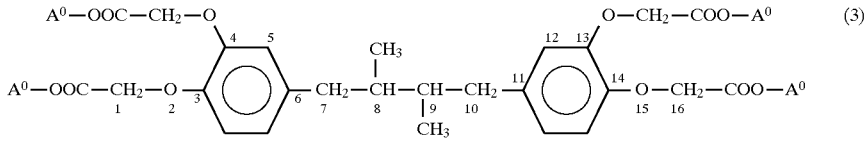

ester group: —COO—A⁰

In the present invention, it is preferred that compound (c) comprises a compound having an alkali-soluble group in an amount of at least 10 mol %, more preferably at least 30 mol %, and most preferably at least 50 mol % based on the total amount of compound (c).

The content of the alkali-soluble group can be expressed as $N_S/(N_B+N_S)$, where $N_S$ is an average number of remaining alkali-soluble groups per one molecule of the dissolution inhibitor in a mixture of the dissolution inhibitors which have the same mother nucleus, and $N_B$ is an average number of tertiary alkyl ester groups per one molecule of the dissolution inhibitor in a mixture of the dissolution inhibitors which have the same mother nucleus. The amount of alkali-soluble group is preferably $0.01 \leq N_S/(N_B+N_S) \leq 0.75$, more preferably, $0.1 \leq N_S/(N_B+N_S) \leq 0.5$. In particular, it is preferred that the component where the proportion of the number of the alkali-soluble group ($N_{1S}$) in one molecule to the number of the tertiary alkyl ester ($N_{1B}$) is $0.1 \leq N_{1S}/(N_{1B}+N_{1S}) \leq 0.5$ is contained in an amount of at least 50% by weight of the total amount of the dissolution inhibitor.

In order that the alkali-soluble group functions in the developer described below, the $pK_a$ value of the alkali-soluble group to be protected by the acid-decomposable bond and the remaining alkali-soluble group is preferably 10 or less. Preferred alkali-soluble groups include a phenolic hydroxyl group, a carboxylic acid group, an imide group, a N-hydroxyimide group, a N-sulfonylamide group, a sulfonamide group, a N-sulfonylurethane group, a N-sulfonylureide group and groups containing active methylene group, and more specifically the following examples can be mentioned.

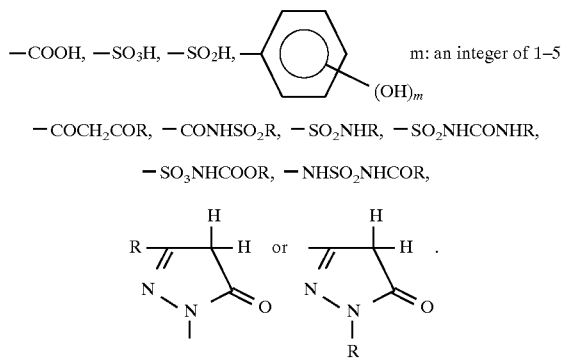

In the above formulae, R is an alkyl group or an aryl group. Preferred examples of the alkyl group include an alkyl group having 1 to 4 carbon atoms such as methyl, ethyl, propyl, n-butyl and t-butyl, with a methyl group being more preferred. Preferred examples of the aryl group include an aryl group having 6 to 10 carbon atoms such as phenyl and tolyl, with a phenyl group being more preferred.

These groups may be introduced in one molecule in combination. However, preferred alkali-soluble groups are not restricted to these examples.

The tertiary alkyl ester group-containing dissolution inhibitor of the present invention may possess a plurality of tertiary alkyl ester groups on one benzene ring, but preferably it is a compound composed of a skeleton where one tertiary alkyl ester is introduced on one benzene ring. The molecular weight of the tertiary alkyl ester group-containing dissolution inhibitor of the present invention is generally not more than 3,000, preferably from 500 to 3,000, and more preferably from 1,000 to 2,500.

In a preferred embodiment of the present invention, the group containing a tertiary alkyl ester group is represented by formula: $—R^0—COO—C(R^{01})(R^{02})(R^{03})$.

In the formula, $R^{01}$, $R^{02}$ and $R^{03}$ may be the same or different and are an alkyl group, a cycloalkyl group or an alkenyl group, which may possess a substituent, preferably an alkyl group having 1 to 6 carbon atoms, a cycloalkyl group having 3 to 10 carbon atoms, or an alkenyl group having 2 to 8 carbon atoms. Two of $R^{01}$ to $R^{03}$ may be bonded to form a ring. $R^0$ is bi- or multi-valent aliphatic or aromatic hydrocarbon group which may have a substituent.

Preferred examples of the alkyl group include an alkyl group having 1 to 4 carbon atoms, such as methyl, ethyl, propyl, n-butyl and sec-butyl; preferred examples of the cycloalkyl group include a cycloalkyl group having 3 to 10 carbon atoms such as cyclopropyl, cyclobutyl, cyclohexyl and adamantyl; and preferred examples of the alkenyl group include an alkenyl group having 2 to 4 carbon atoms such as vinyl, propenyl, allyl, and butenyl.

Examples of the substituent include a hydroxyl group, a halogen atom (fluorine, chlorine, bromine, and iodine), a nitro group, a cyano group, an alkyl group such as those mentioned above, an alkoxy group such as methoxy, ethoxy, hydroxyethoxy, propoxy, hydroxypropoxy, n-butoxy, isobutoxy, sec-butoxy, and t-butoxy, an alkoxycarbonyl group such as methoxycarbonyl and ethoxycarbonyl, an aralkyl group such as benzyl, phenethyl, and cumyl, an aralkyloxy group, an acyl group such as formyl, acetyl, butyryl, benzoyl, cyanamyl, and valeryl, an acyloxy group such as butyryloxy, an alkenyl group such as those mentioned above, an alkenyloxy group such as vinyloxy, propenyloxy, allyloxy, and butenyloxy, an aryl group such as phenyl, tolyl, and naphthyl, an aryloxy group such as phenoxy, and an aryloxycarbonyl group such as benzoyloxy.

t-Butyl ester group, t-pentyl ester group, t-hexyl ester group, 2-cyclopropyl-2-propyl ester group, etc. are preferred, and t-butyl ester group is particularly preferred.

Preferably included are compounds in which part or whole of the phenolic OH group in a polyhydroxy compound described in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, JP-A-4-271349, JP-A-5-45869, JP-A-5-158233, JP-A-5-224409, JP-A-5-257275, JP-A-5-297581, JP-A-5-297583, JP-A-5-309197, JP-A-5-303200, etc. is bonded to the formula: $—R^0—COO—C(R^{01})(R^{02})(R^{03})$ to be protected.

More preferably, compounds using a polyhydroxy compound described in JP-A-1-289946, JP-A-3-128959, JP-A-

3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, JP-A-5-224409, JP-A-5-297581, JP-A-5-297583, JP-A-5-309197, and JP-A-5-303200 can be mentioned.
To be specific, compounds represented by formulae [V] to [XX] can be mentioned.
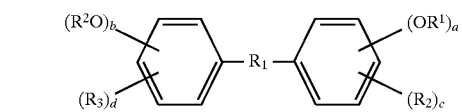
[V]
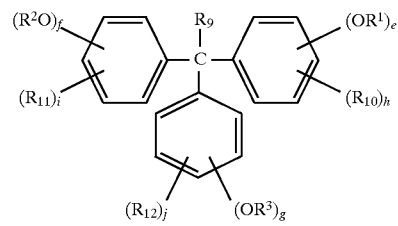
[VI]
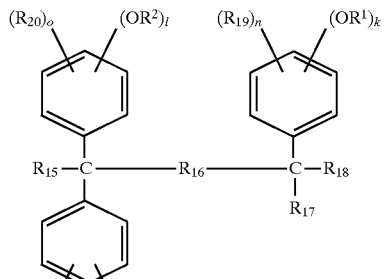
[VII]
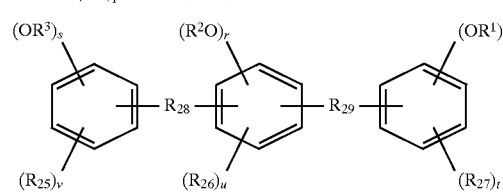
[VIII]
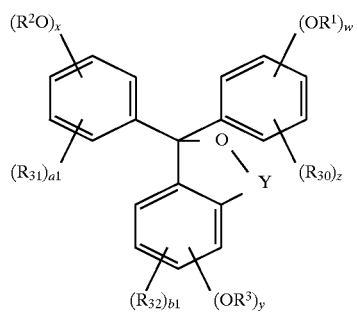
[IX]
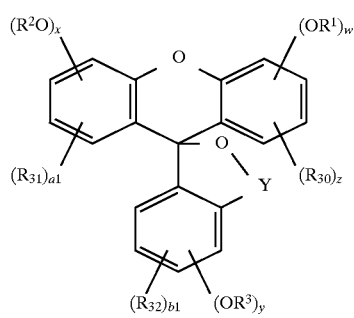
[X]
-continued
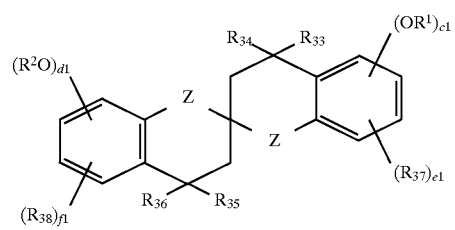
[XI]
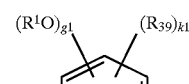
[XII]
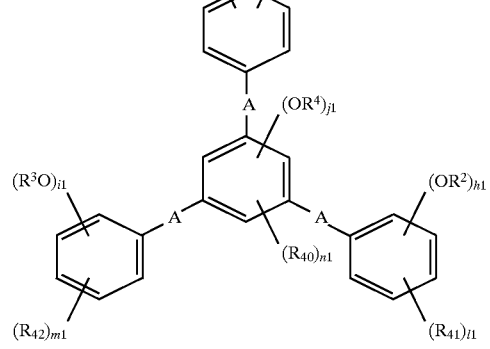
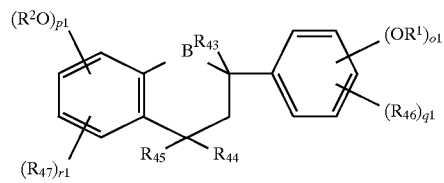
[XIII]
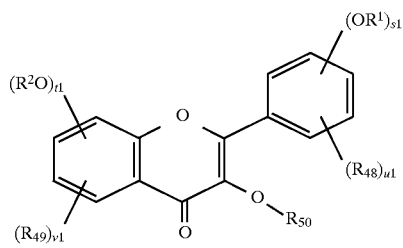
[XIV]
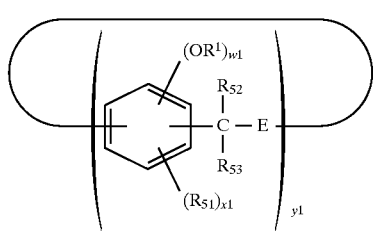
[XV]

-continued

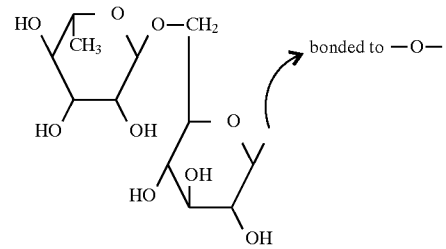
[XVI]

wherein
$R^1$, $R^2$, $R^3$ and $R^4$ may be the same or different and are a hydrogen atom or $-R^0-COO-C(R^{01})(R^{02})(R^{03})$;
$R_1$ is $-CO-$, $-COO-$, $-NHCONH-$, $-NHCOO-$, $-O-$, $-S-$, $-SO-$, $-SO_2-$, $-SO_3-$ or

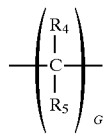

where $G=2$ to 6, provided that when $G=2$, at least one of $R_4$ and $R_5$ is an alkyl group;
$R_4$ and $R_5$ may be the same or different and are a hydrogen atom, an alkyl group, an alkoxy group, $-OH$, $-COOH$, $-CN$, a halogen atom, $-R_6-COOR_7$ or $-R_8-OH$,
$R_6$ and $R_8$ are independently an alkylene group;
$R_7$ is a hydrogen atom, an alkyl group, an aryl group or an aralkyl group;
$R_2$, $R_3$, $R_9$ to $R_{12}$, $R_{15}$, $R_{17}$ to $R_{21}$, $R_{25}$ to $R_{27}$, $R_{30}$ to $R_{32}$, $R_{37}$ to $R_{42}$, $R_{46}$ to $R_{49}$, and $R_{51}$ may be the same or different and are a hydrogen atom, a hydroxyl group, an alkyl group, an alkoxy group, an acyl group, an acyloxy group, an aryl group, an aryloxy group, an aralkyl group, an aralkyloxy group, a halogen atom, a nitro group, a carboxyl group, a cyano group, or $-N(R_{13})(R_{14})$;
where $R_{13}$ and $R_{14}$ are independently a hydrogen atom, an alkyl group or an aryl group;
$R_{16}$ is a single bond, an alkylene group or

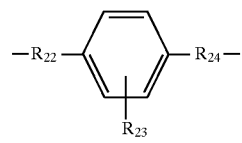

$R_{22}$ and $R_{24}$ may be the same or different and are a single bond, an alkylene group, $-O-$, $-S-$, $-CO-$, or a carboxyl group;
$R_{23}$ is a hydrogen atom, an alkyl group, an alkoxy group, an acyl group, an acyloxy group, an aryl group, a nitro group, a hydroxy group, a cyano group, or a carboxyl group, where the hydroxy group may be substituted with a t-butoxycarbonyl group;
$R_{28}$ and $R_{29}$ may be the same or different and are a methylene group, a lower alkyl-substituted methylene group, a halomethylene group, or a haloalkyl group;
$R_{33}$ to $R_{36}$ may be the same or different and are a hydrogen atom or an alkyl group;
$R_{43}$ to $R_{45}$ may be the same or different and are a hydrogen atom, an alkyl group, an alkoxy group, an acyl group, or an acyloxy group;
$R_{50}$ is a hydrogen atom, a t-butoxycarbonyl group or $R_{52}$ and $R_{53}$ may be the same or different and are a hydrogen atom, a lower alkyl group, a lower haloalkyl group or an aryl group;
$R_{54}$ to $R_{57}$ may be the same or different and are a hydrogen atom, a hydroxyl group, a halogen atom, a nitro group, a cyano group, a carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group or an aryloxycarbonyl group, provided that the four substituents represented by the same symbol may be the same or different;
Y is $-CO-$ or $-SO_2-$;
Z and B are independently a single bond or $-O-$;
A is a methylene group, a lower alkyl-substituted methylene group, a halomethylene group or a haloalkyl group;
E is a single bond or oxymethylene group;
when a to z, $a_1$ to $y_1$ are two or more, the group in the parentheses may be the same or different;
a to q, s, t, v, $g_1$ to $i_1$, $k_1$ to $m_1$, $o_1$, $q_1$, $s_1$, and $u_1$ are independently 0 or an integer of 1 to 5;
r, u, w, x, y, z, $a_1$ to $f_1$, $p_1$, $r_1$, $t_1$, $v_1$ to $x_1$ are independently 0 or an integer of 1 to 4;
$j_1$, $n_1$, $z_1$, $a_2$, $b_2$, $c_2$, and $d_2$ are independently 0 or an integer of 1 to 3, provided that at least one of $z_1$, $a_2$, $c_2$, and $d_2$ is 1 or more;
$y_1$ is an integer of 3 to 8;
$(a+b)$, $(e+f+g)$, $(k+l+m)$, $(q+r+s)$, $(w+x+y)$, $(c_1+d_1)$, $(g_1+h_1+i_1+j_1)$, $(o_1+p_1)$, and $(s_1+t_1) \geq 2$;
$(j_1+n_1) \leq 3$;
$(r+u)$, $(w+z)$, $(x+a_1)$, $(y+b_1)$, $(c_1+e_1)$, $(d_1+f_1)$, $(p_1+r_1)$, $(t_1+v_1)$, and $(x_1+w_1) \leq 4$, provided that in the case of formula [IX], $(w+z)$ and $(x+a_1) \leq 5$; and
$(a+c)$, $(b+d)$, $(e+h)$, $(f+i)$, $(g+j)$, $(k+n)$, $(l+o)$, $(m+p)$, $(q+t)$, $(s+v)$, $(g_1+k_1)$, $(h_1+l_1)$, $(i_1+m_1)$, $(o_1+g_1)$, and $(s_1+u_1) \leq 5$.

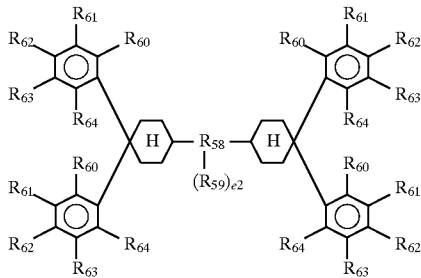
[XVII]

wherein $R_{58}$ is an organic group, a single bond, —S—, —SO—, or

$R_{59}$ is a hydrogen atom, a monovalent organic group or

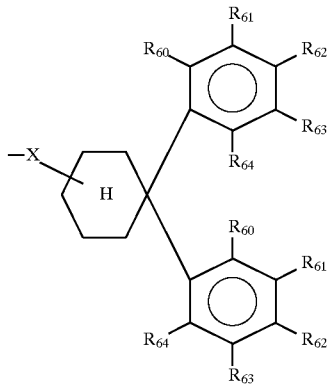

where $R_{60}$ to $R_{64}$ may be the same or different and are a hydrogen atom, a hydroxy group, a halogen atom, an alkyl group, an alkoxy group, an alkenyl group or the group, —O—$R^0$—COO—C($R^{01}$)($R^{02}$)($R^{03}$); provided that at least two of $R_{60}$ to $R_{64}$ are the group, —O—$R^0$—COO—C($R^{01}$)($R^{02}$)($R^{03}$) and each 4 to 6 substituents represented by the same symbol may be the same or different; and X is a divalent organic group; and $e_2$ is 0 or 1.

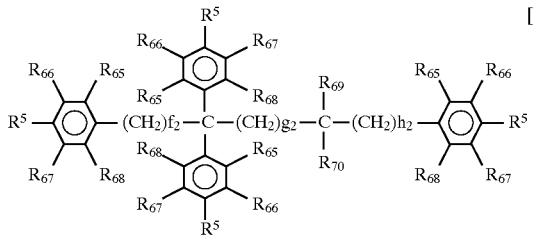
[XVIII]

wherein $R_{65}$ to $R_{68}$ may be the same or different and are a hydrogen atom, a hydroxy group, a halogen atom, an alkyl group, an alkoxy group, or an alkenyl group; provided that each 4 to 6 substituents represented by the same symbol may be the same or different;

$R_{69}$ and $R_{70}$ are a hydrogen atom, an alkyl group or

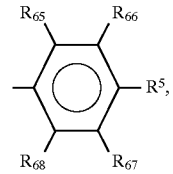

at least two of $R_5$ are the group, —O—$R^0$—COO—C($R^{01}$)($R^{02}$)($R^{03}$) and the other substituents are a hydrogen atom or a hydroxy group; and $f_2$, $g_2$, and $h_2$ are 0 or an integer of 1 to 5.

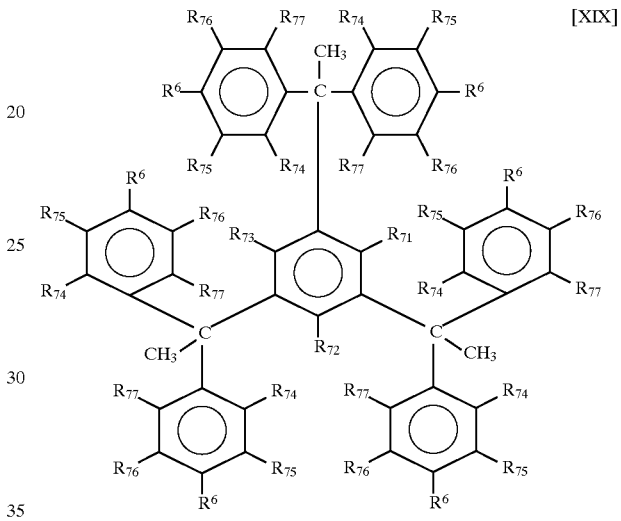
[XIX]

wherein $R_{71}$ to $R_{77}$ may be the same or different, and are a hydrogen atom, a hydroxy group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aryloxy group or an aralkoxy group; provided that 6 substituents represented by each of $R_{74}$ to $R_{77}$ may be the same or different; and at least two of $R_6$ are the group, —O—$R^0$—COO—C($R^{01}$)($R^{02}$)($R^{03}$) and the other substituents are a hydrogen atom or a hydroxy group.

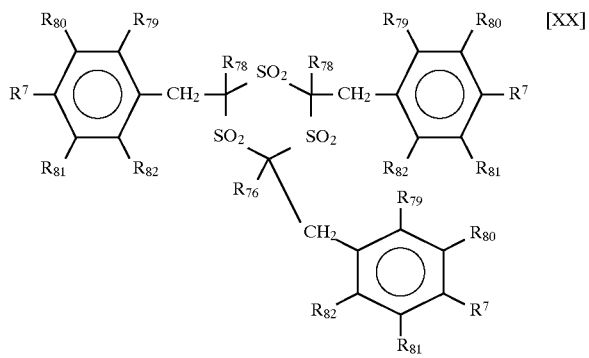
[XX]

wherein $R_{78}$ is a hydrogen atom or an alkyl group; provided that all the substituents may be the same or different;

$R_{79}$ to $R_{82}$ are a hydrogen atom, a hydroxy group, a halogen atom, an alkyl group or an alkoxy group; provided that each three substituents represented by the same symbol may be the same or different; and at least two of $R_7$ are the group, $-O-R^0-COO-C(R^{01})(R^{02})(R^{03})$ and the other substituents are a hydrogen atom or a hydroxy group.

Typical examples of preferred compounds will be described.

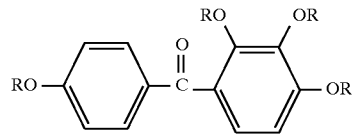 (1)

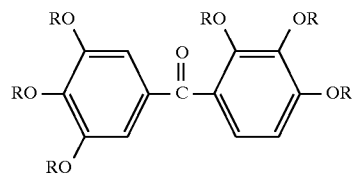 (2)

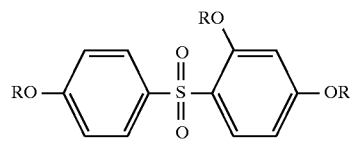 (3)

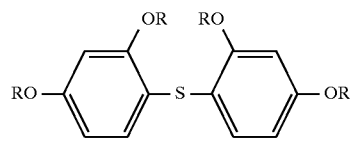 (4)

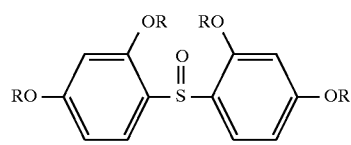 (5)

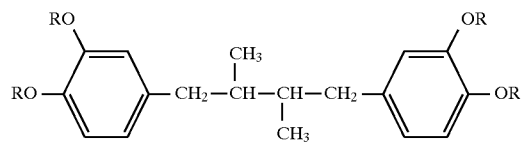 (6)

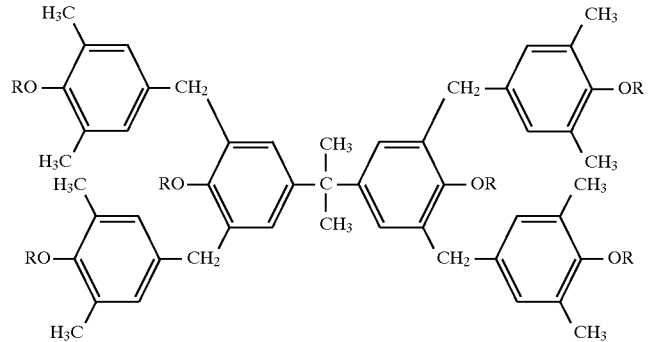 (7)

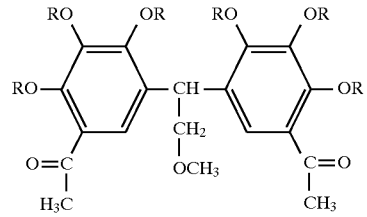 (8)

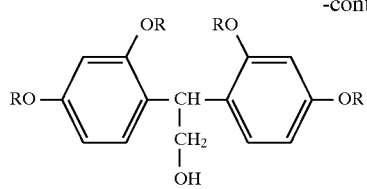
(9)
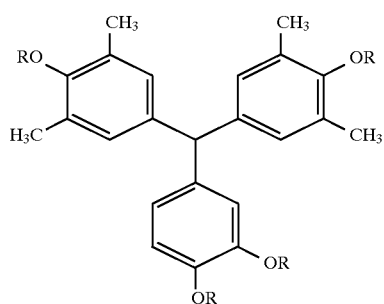
(10)
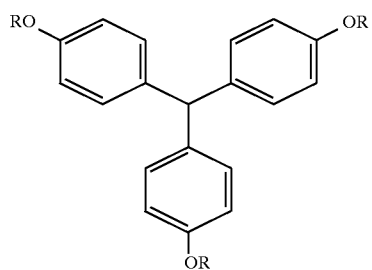
(11)
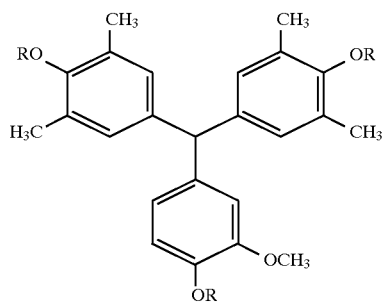
(12)
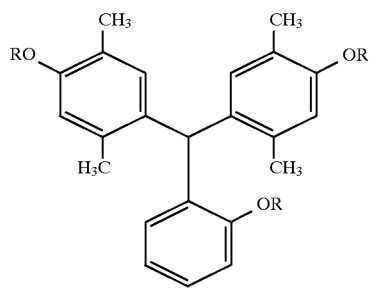
(13)
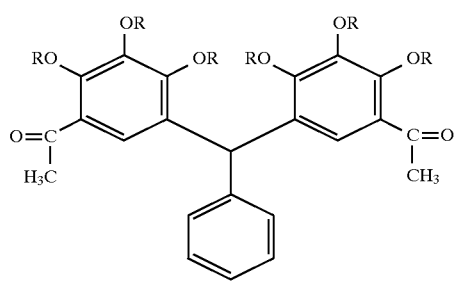
(14)

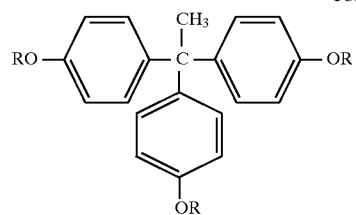
(15)
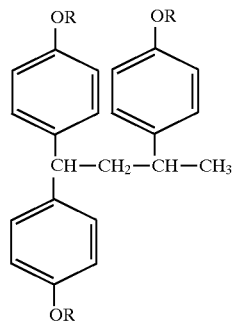
(16)
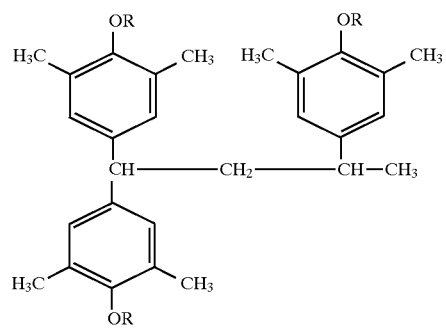
(17)
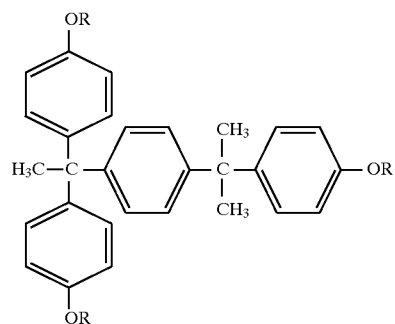
(18)
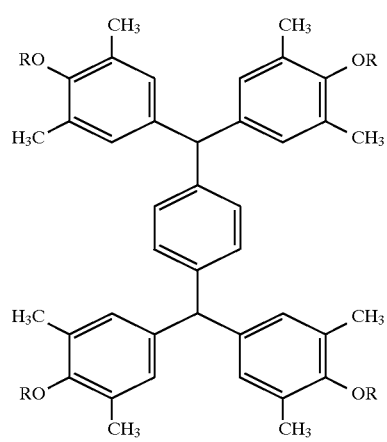
(19)

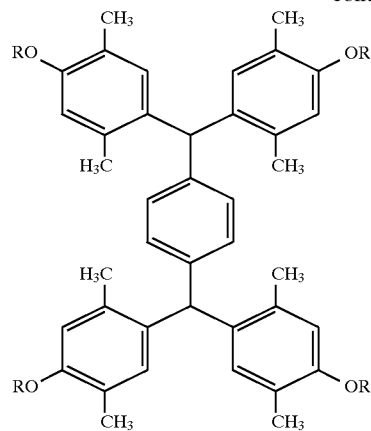 (20)
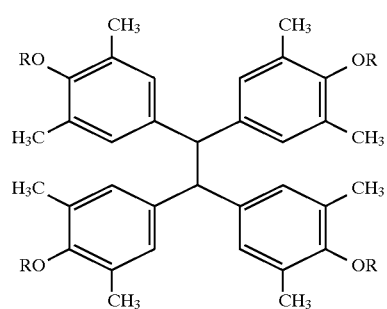 (21)
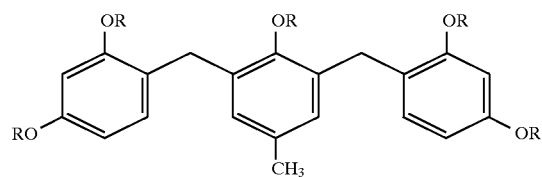 (22)
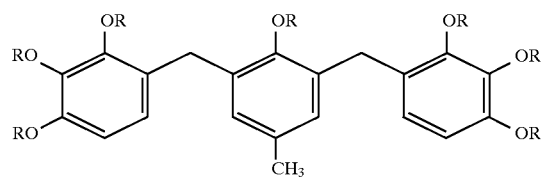 (23)
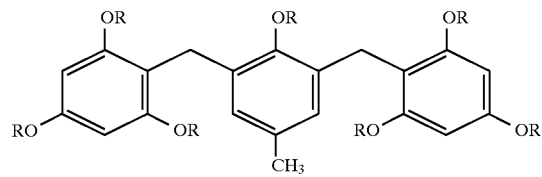 (24)
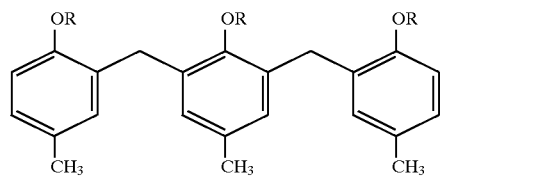 (25)
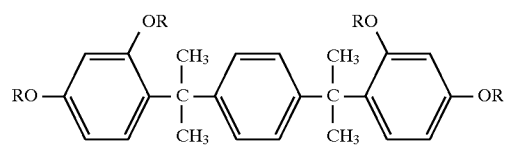 (26)

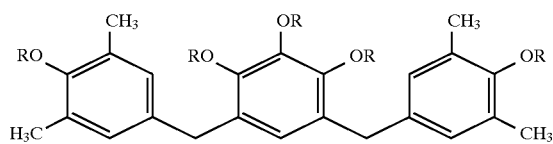
(27)
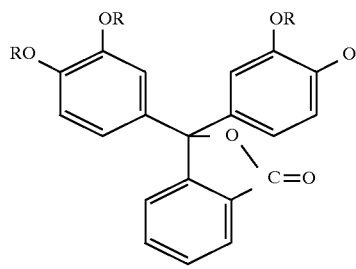
(28)
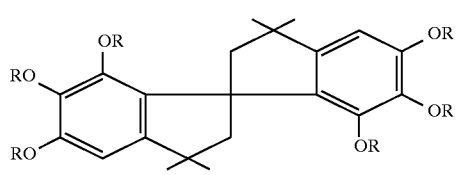
(29)
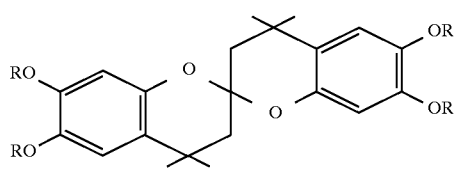
(30)
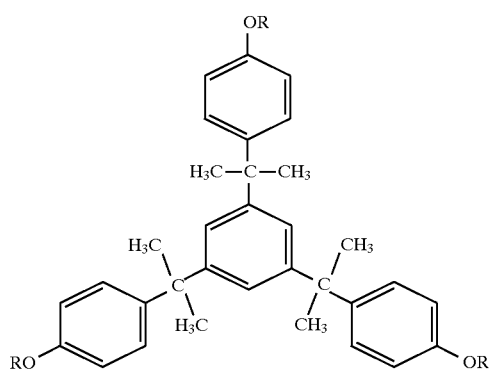
(31)
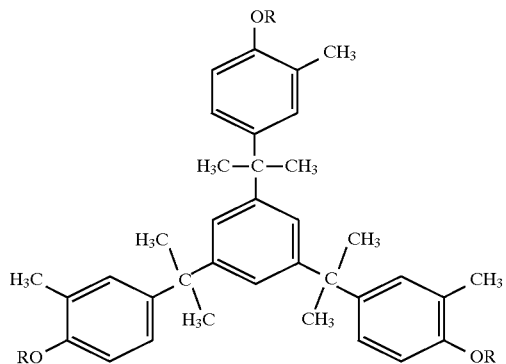
(32)

-continued
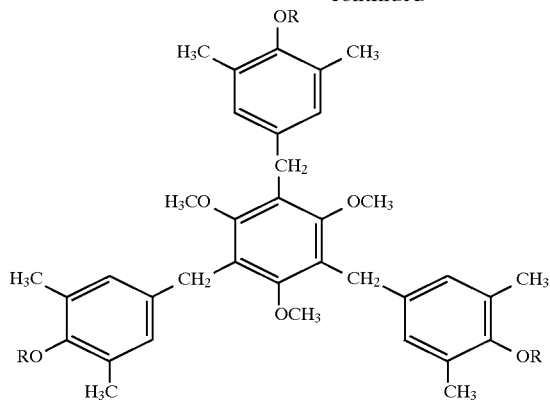
(33)
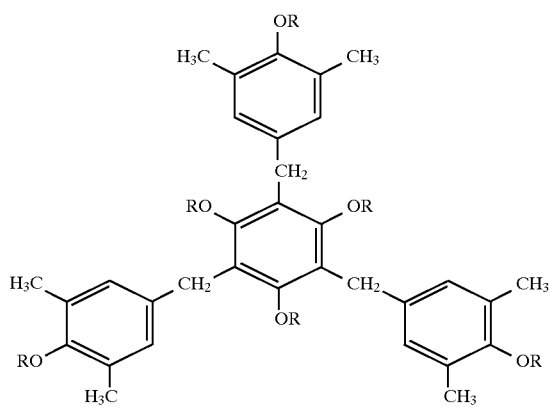
(34)
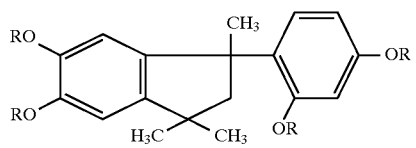
(35)
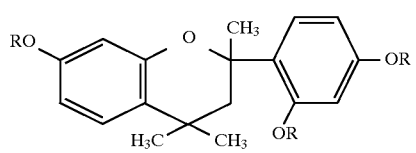
(36)
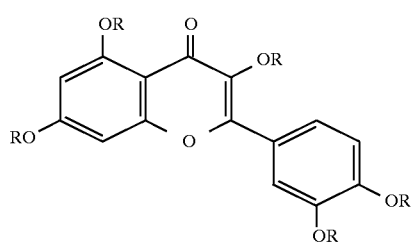
(37)
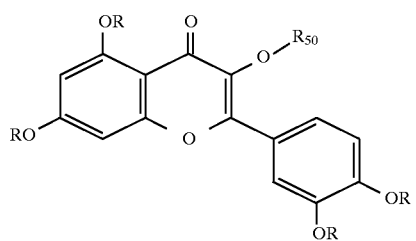
(38)
wherein $R_{50}$ is:

-continued
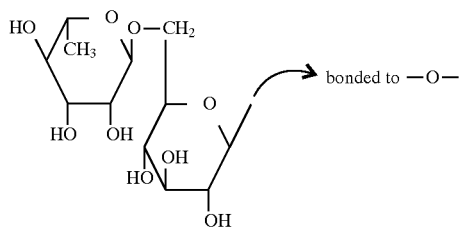
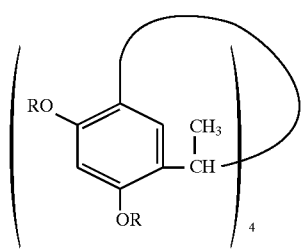
(39)
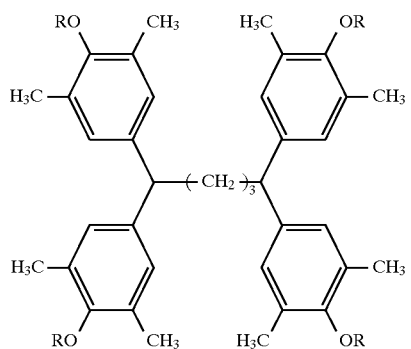
(40)
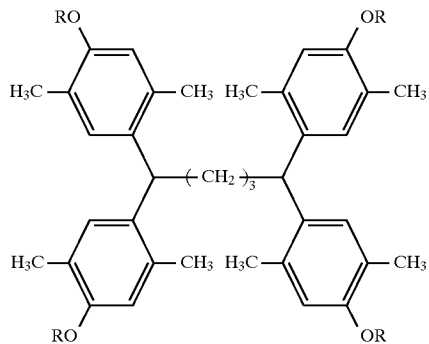
(41)
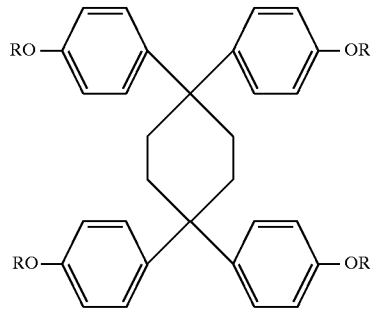
(42)

-continued
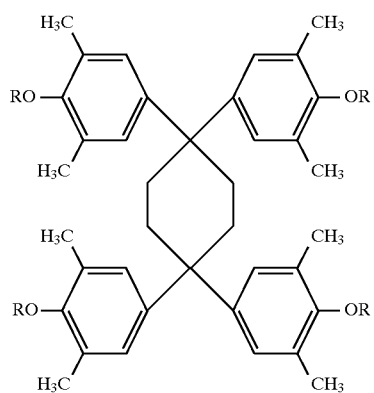
(43)
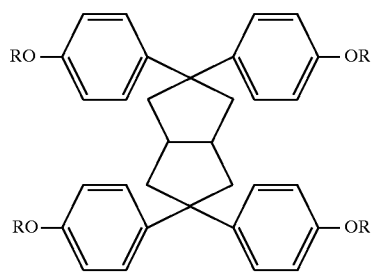
(44)
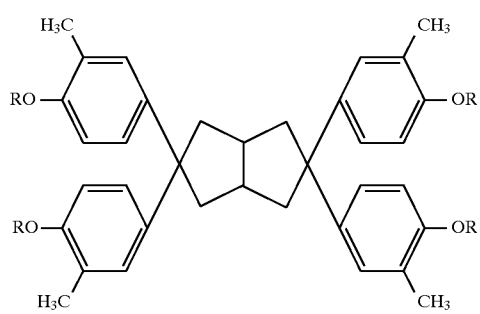
(45)
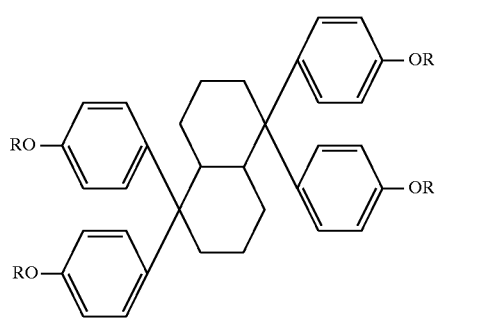
(46)
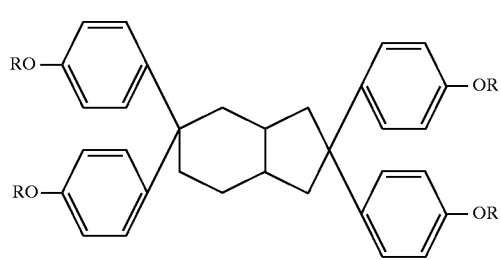
(47)

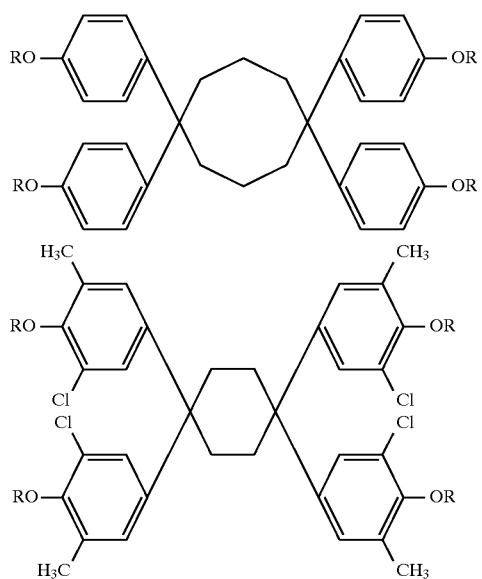
(48)
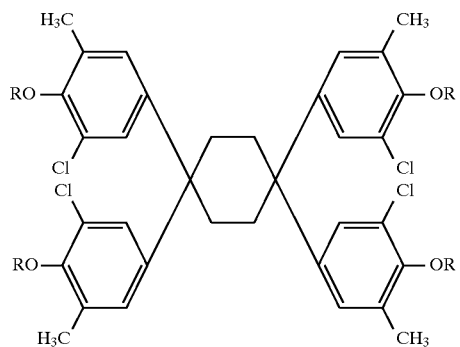
(49)
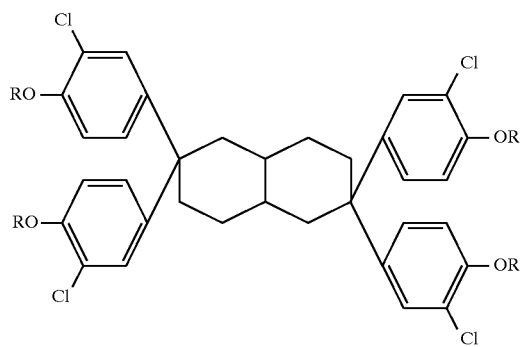
(50)
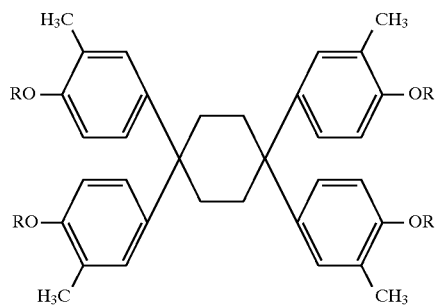
(51)
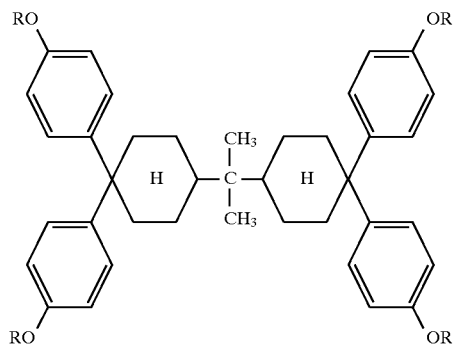
(52)

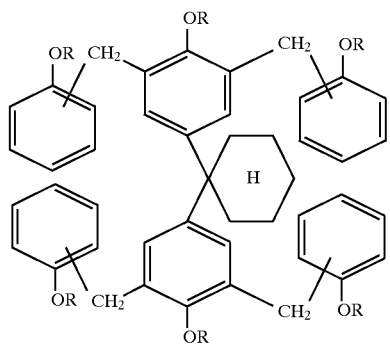
(53)
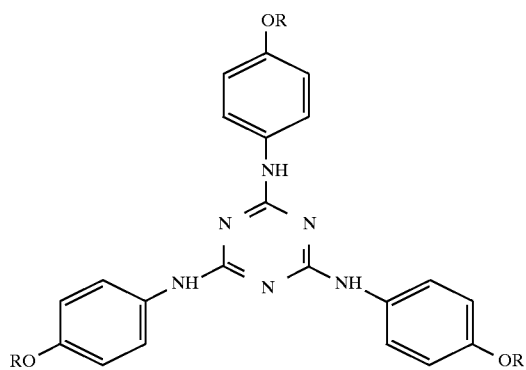
(54)
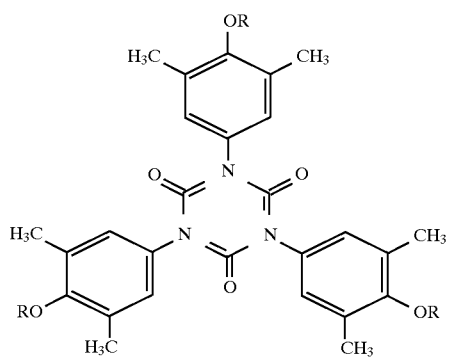
(55)
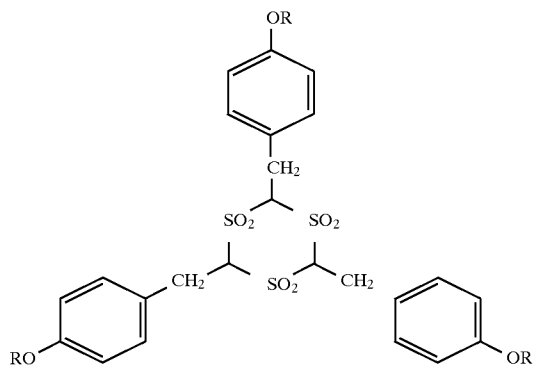
(56)

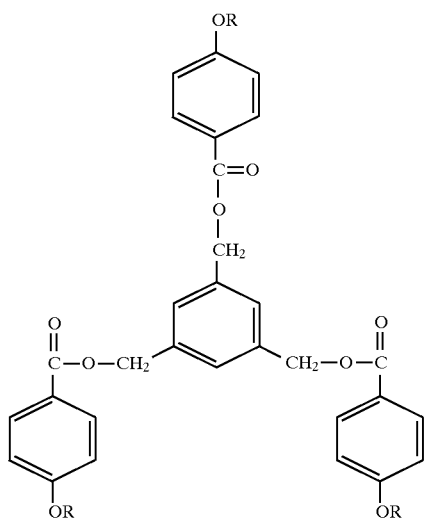
(57)
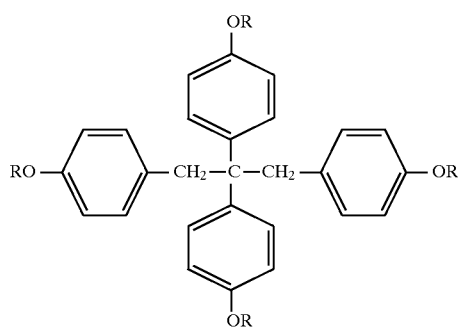
(58)
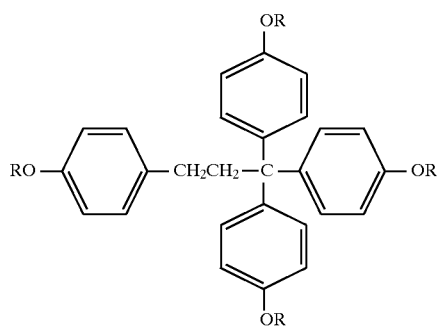
(59)
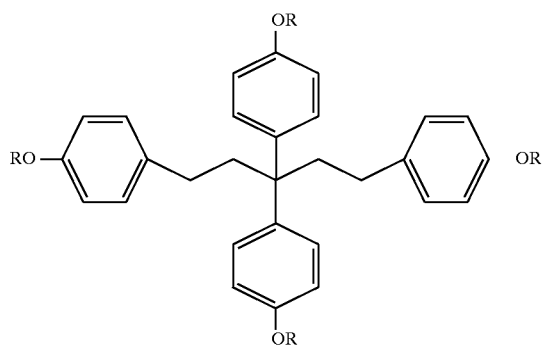
(60)

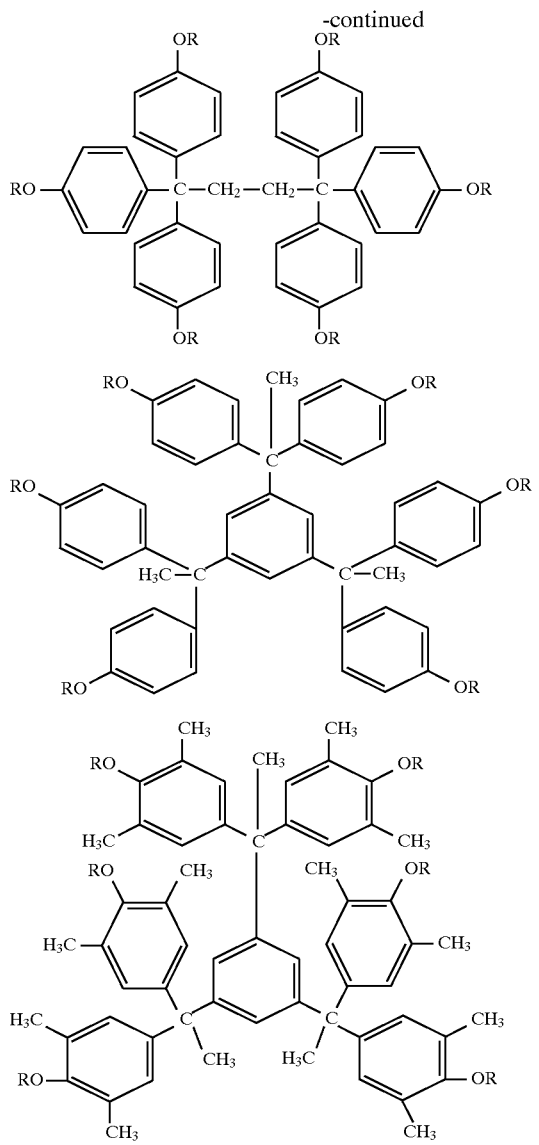

In compounds (1) to (63), R represents —CH$_2$—COO—C$_4$H$_9^t$ or a hydrogen atom, wherein at least two or, depending on the structure, at least three groups are groups other than a hydrogen atom, and $0.01 \leq N_S/(N_B+N_S) \leq 0.75$; where $N_B$ is an average number of acid-decomposable groups in the dissolution inhibitor and $N_S$ is an average number of the alkali-soluble groups.

An amount of compound (c) used in the present invention is generally from 3 to 50% by weight, preferably from 5 to 35% by weight, based on the total weight of the photosensitive composition (except for the solvent).

(B) Alkali-soluble resin (a) of the present invention

The resin used in the present invention which is insoluble in water but is soluble in an aqueous alkali solution is basically a copolymer comprising a styrene derivative having a hydroxy group in the p-position and a styrene derivative having no hydroxy group in the p-position. Homopolymer of p-hydroxystyrene has a high solubility in an alkali developer and has an insufficient efficiency of an interaction with the dissolution inhibitor to be combined. Consequently, this polymer generally has a decreased effect of suppressing the dissolving through the dissolution inhibitor. When a styrene derivative having no p-hydroxy group is copolymerized therewith, the solubility of the polymer in an alkali developer is decreased and, at the same time, the efficiency for the interaction with the dissolution inhibitor becomes high, showing a sufficient dissolving suppression effect. It is preferred for enhancing the dissolving suppression effect that $R_{O4}$ in the above formula (B) is a group other than a hydrogen atom. The use of the copolymer of the present invention makes it possible to exhibit a high dissolving suppression effect in combination with the dissolution inhibitor as well as the appropriate solubility of the polymer in an alkali developer.

Preferred typical examples of the structure units contained in the alkali-soluble resin (a) of the present invention represented by formulae (A) to (E) will be described below. In the typical examples, R is a hydrogen atom or a methyl group.

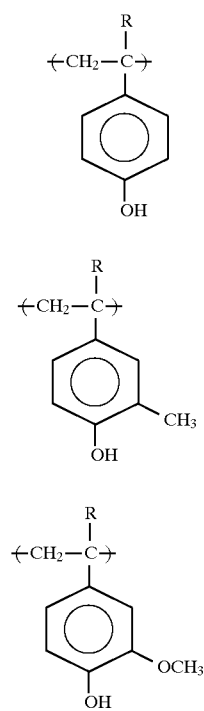 (A-1)
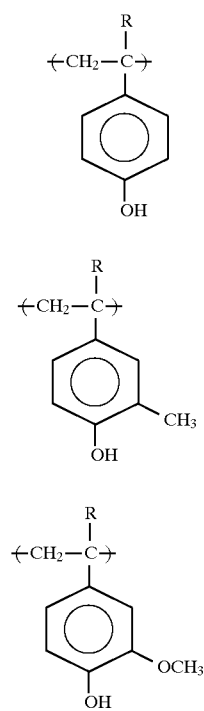 (A-2)
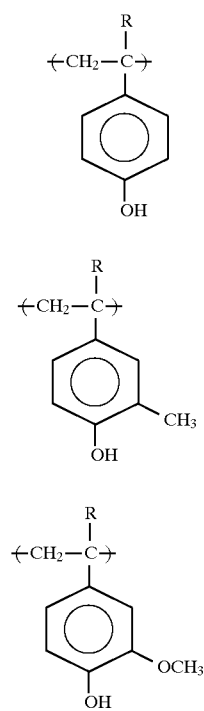 (A-3)
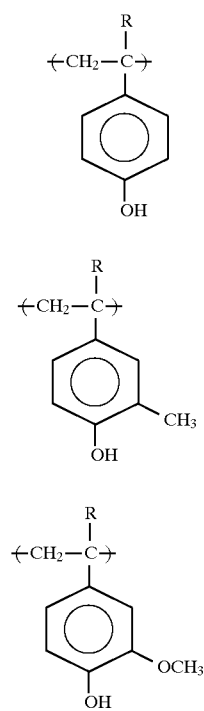 (A-4)
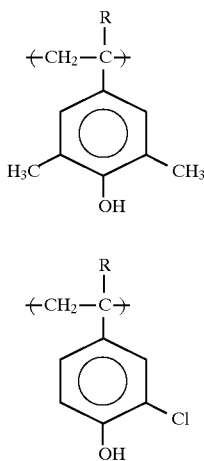 (A-5)
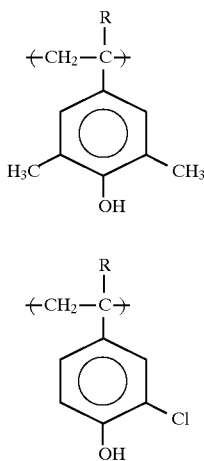 (A-6)
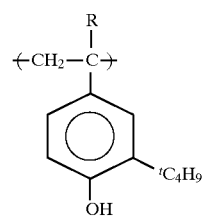 (A-7)
-continued
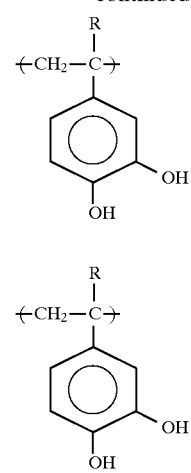 (A-8)
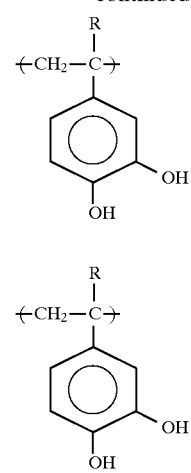 (A-9)
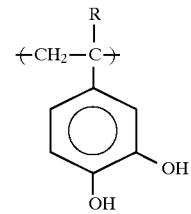 (A-10)
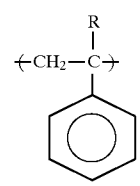 (B-1)
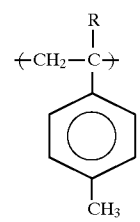 (B-2)
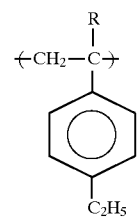 (B-3)
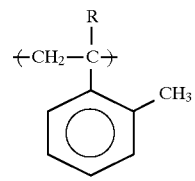 (B-4)

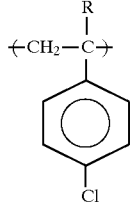 (B-5)
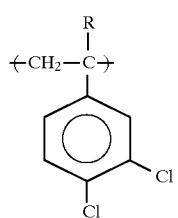 (B-6)
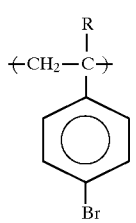 (B-7)
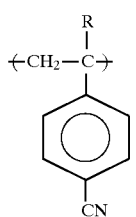 (B-8)
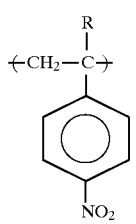 (B-9)
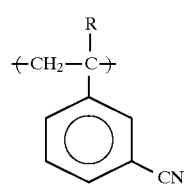 (B-10)
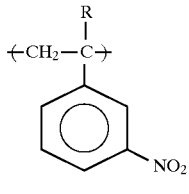 (B-11)
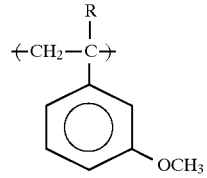 (B-12)
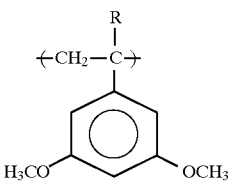 (B-13)
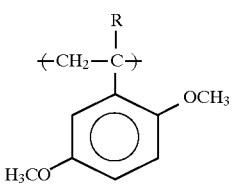 (B-14)
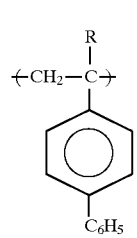 (B-15)
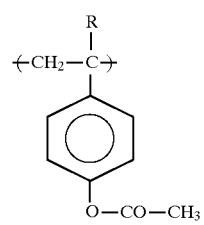 (C-1)
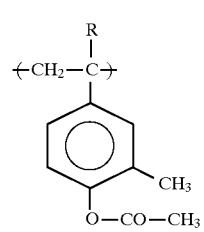 (C-2)
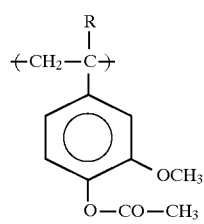 (C-3)
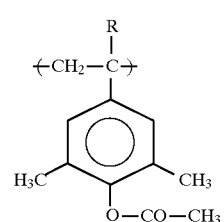 (C-4)

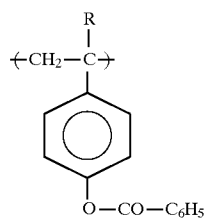 (C-5)
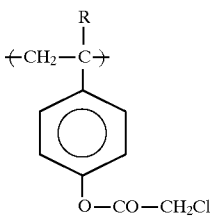 (C-6)
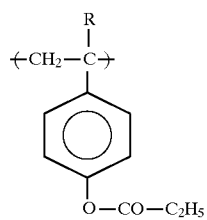 (C-7)
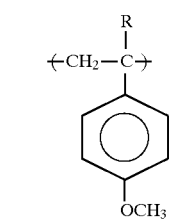 (C-8)
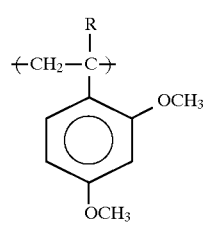 (C-9)
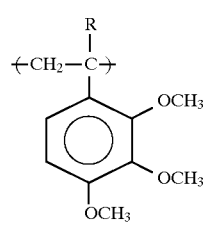 (C-10)
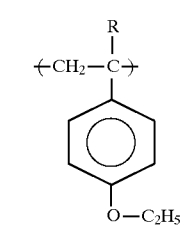 (C-11)
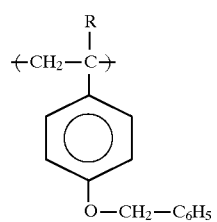 (C-12)
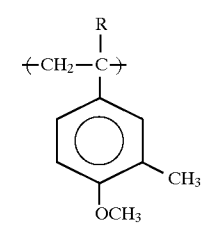 (C-13)
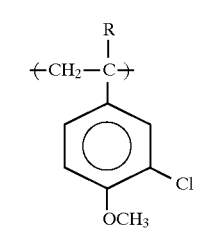 (C-14)
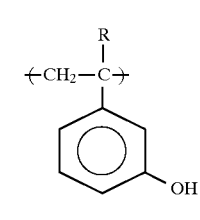 (D-1)
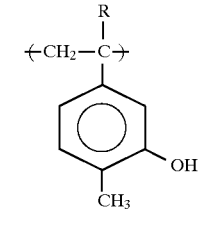 (D-2)
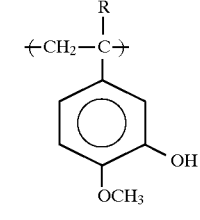 (D-3)
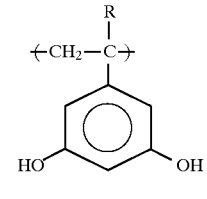 (D-4)

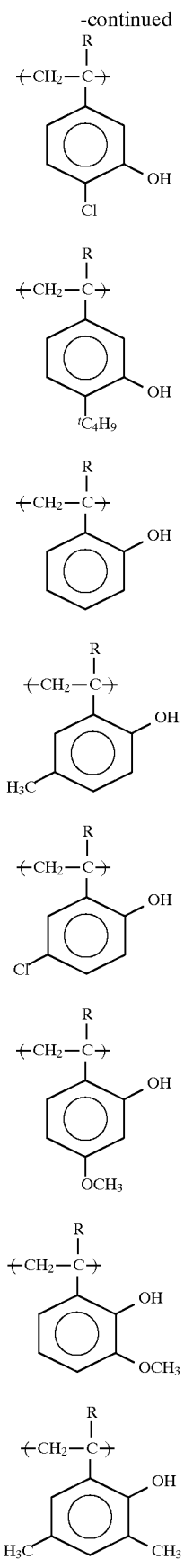

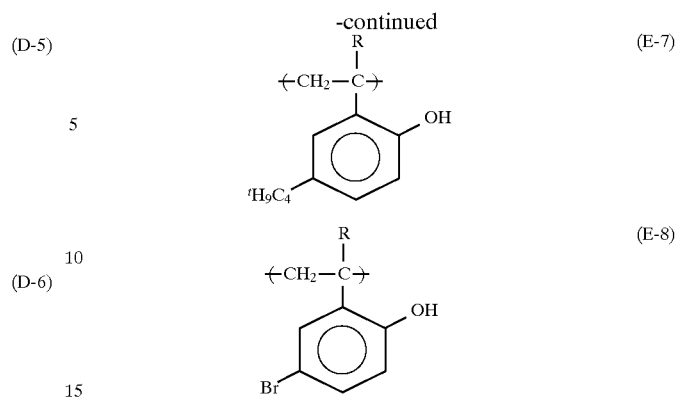

A preferred molar ratio of the structure unit represented by formula (A) to the structure unit represented by formula (B) and/or (C) is from 95/5 to 50/50, more preferably from 90/10 to 60/40, and most preferably from 90/10 to 70/30.

A preferred molar ratio of the structure unit represented by formula (A) to the structure unit represented by formula (D) and/or (E) is from 95/5 to 10/90, more preferably 90/10 to 20/80, and most preferably from 80/20 to 30/70.

The resin comprising the structure units of formulae (A) and (B) preferably further comprises at least one of the structure units of formulae (D) and (E). In this case, the molar ratio of the structure unit of formula (D) and/or (E) to the structure unit (A) is generally from 95/5 to 10/90, preferably from 90/10 to 20/80, and more preferably from 90/10 to 30/70.

The weight average molecular weight of alkali-soluble resin (a) of the present invention is preferably in the range of from 1,000 to 200,000, more preferably from 5,000 to 80,000. If the molecular weight is less than 1,000, the film at an unexposed portion after the development is largely decreased. From the viewpoint of enhancing the heat resistance, the molecular weight of not less than 20,000, preferably not less than 25,000 is desirable.

The weight average molecular weight is defined as a polystyrene conversion value using a gel permeation chromatography.

These alkali-soluble resin (a) of the present invention can be used as a mixture of two or more resins. Further, other alkali-soluble resins such as poly(p-hydroxystyrene resin), hydrogenated poly(p-hydroxystyrene resin), poly(m-hydroxystyrene resin), hydrogenated poly(m-hydroxystyrene resin), poly(o-hydroxystyrene resin), hydrogenated poly(o-hydroxystyrene resin), novolac resin, hydrogenated novolac resin, acetone-pyrogallol resin, carboxyl group-containing methacrylic resin, etc. may optionally be mixed. The photosensitive composition of the present invention generally contains the alkali-soluble resin in a total amount of 50 to 95% by weight, preferably from 55 to 85% by weight, more preferably from 60 to 80% by weight.

The content of alkali-soluble resin (a) of the present invention in the total alkali-soluble resin is generally from 40 to 100% by weight, preferably from 50 to 100% by weight, and more preferably from 60 to 100% by weight. In the case of a mixture with novolac resin, if the content is less than 40% by weight, the absorption at 248 nm is increased, whereby the rectangle of pattern at the time of far infrared exposure is decreased.

(c) Compound which generates an acid with irradiation of an active ray or radiation (compound (c) of the present invention)

The compound which generates an acid with irradiation of an active ray or radiation can be suitably selected from photochemical initiators for photochemical cation polymerization, photochemical initiators for a photochemical radical polymerization, photo chemical discoloring agents such as those comprising a dye, photochemical color changing agents and known compounds which generate an acid through light used in micro-resist and a mixture thereof.

Examples include diazonium salts described in S. I. Schlesinger, Photogr. Sci. Eng., 18, 387 (1974), T. S. Bal et al, Polymer, 21, 423 (1980), etc.; ammonium salts described in U.S. Pat. Nos. 4,069,055 and 4,069,056, U.S. Pat. No. Re 27,992, Japanese Patent Application No. 3-140140, etc.; onium salts such as phosphonium salts described in D. C. Necker et al., Macromolecules, 17, 2468 (1984), C. S. Wen et al., Teh, Proc. Conf. Rad. Curing ASIA, p. 478, Tokyo, October. (1988), U.S. Pat. Nos. 4,069,055 and 4,069,056, etc., iodonium salts described in J. V. Crivello et al., Macromolecules, 10 (6) 1307 (1977), Chem. & Eng. News, Nov. 28, p. 31 (1988), European patent No. 104,143, U.S. Pat. Nos. 339,049 and 410,201, JP-A-2-150848, JP-A-2-296514, etc., sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), European patent Nos. 370,693, 3,902,114, 233,567, 297,443, and 297,442, U.S. Pat. Nos. 4,933,377, 161,811, 410,201, 339, 049, 4,760,013, 4,734,444, and 2,833,827, German patent Nos. 2,904,626, 3,604,580, and 3,604,581, etc., selenonium salts described in J. V. Crivello et al., Macromolecules, 10 (6), 1307 (1977), J. V. Crivello et al., Polymer Sci., Polymer Chem. Ed., 17, 1047 (1979), etc., arsonium salts described in C. S. Wen et al., Teh, Proc. Conf. Rad. Curing ASIA, p. 478, Tokyo, October. (1988), etc., organic halogenides described in U.S. Pat. No. 3,905,815, JP-B-46-4605 (the term "JP-B" as used herein means Japanese examined patent publication), JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organometal/organic halogenides described in K. Meier et al., J. Rad. Curing 13 (4), 26 (1986), T. P. Gill et al., Inorg. Chem., 19, 3007 (1980), D. A. struc, Acc. Chem. Res., 19 (12), 377 (1896), JP-A-2-161445, etc.; photo-acid generators having an o-nitrobenzyl type protective group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European patent Nos. 0290,750, 046,083, 156,535, 271,851, and 0,388,343, U.S. Pat. Nos. 3,901,710 and 4,181,531, JP-A-60-198538, JP-A-53-133022, etc.; compounds which are photochemically decomposed to generate sulfonic acid represented by iminosulfonate described in M. TUNOOKA et al., Polymer Preprints Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), European patent Nos. 0199,672, 84515, 199,672, 044,115, and 0101,122, U.S. Pat. Nos. 4,618,564, 4,371,605, and 4,431,774, JP-A-64-18143, JP-A-2-245756, JP-A-4-365048, etc., and disulfone compounds described in JP-A-61-166544, etc.

Furthermore, compounds in which these groups or compounds which generate an acid through light are introduced in the main chain or a side chain, for example, compounds described in M. E. Woodhouse et al., J. Am. Chem. Soc., 104, 5586 (1982), S. P. Pappas et al., J. Imaging Sci., 30 (5), 218 (1986), S. Kondo et al., Makromol. Chem., Rapid Commun., 9,625 (1988), Y. Yamada et al, Makromol. Chem., 152, 153, 163 (1972), J. V. Crivello et al., J. Polymer Sci., Polymer Chem. Ed., 17, 3845 (1979), U.S. Pat. No. 3,849,137, German patent No. 3,914,407, JP-A-63-26653, JP-A-55-164824, JP-A-62-69263, JP-A-63-146038, JP-A-63-163452, JP-A-62-153853, JP-A-63-146029, etc. can be used.

Moreover, compounds which generate an acid through light described in V. N. R. Pillai, Synthesis, (1), 1 (1980), A. Abad et al., Tetrahedron Lett., (47) 4555 (1971), D. H. R. Barton et al., J. Chem. Soc., (C), 329 (1970), U.S. Pat. No. 3,779,778, European patent No. 126,712, etc. can also be used.

Of the compounds which generate an acid with irradiation of an active ray or a radiation, those which are particularly used effectively will be described.

(1) Oxazole derivative represented by formula (PAG1) and S-triazine derivative represented by formula (PAG2), each being substituted with a trihalomethyl group.

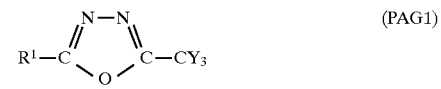

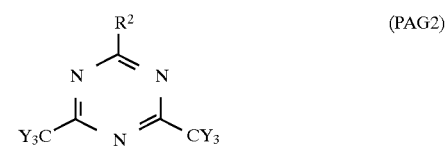

wherein $R^1$ is a substituted or unsubstituted, aryl group or alkenyl group, $R^2$ is a substituted or unsubstituted, aryl group, alkenyl group or alkyl group, or $-CY^3$, where Y is a chlorine atom or a bromine atom.

Typical examples included, but are not restricted to:

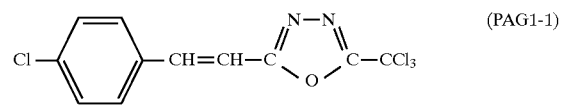

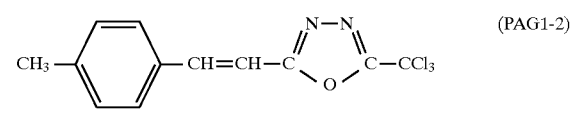

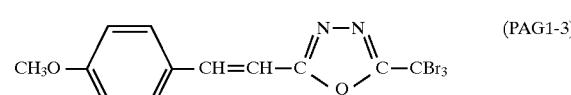

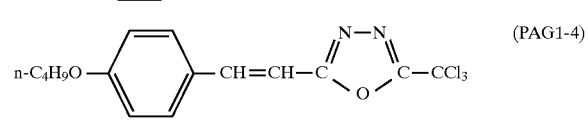

-continued
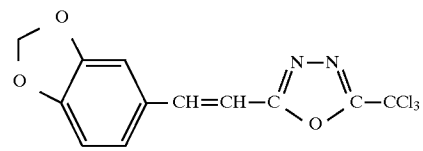 (PAG1-5)
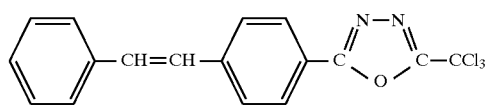 (PAG1-6)
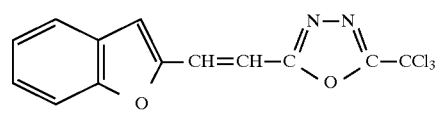 (PAG1-7)
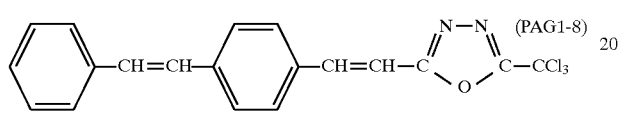 (PAG1-8)
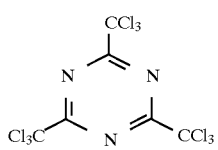 (PAG2-1)
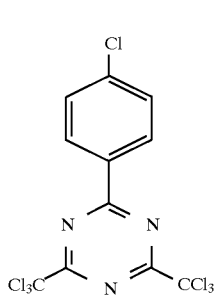 (PAG2-2)
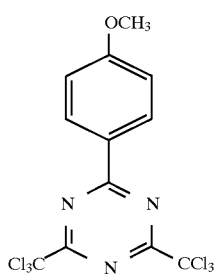 (PAG2-3)
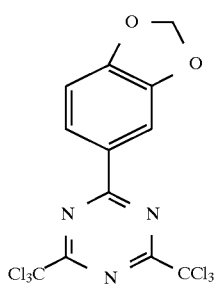 (PAG2-4)
-continued
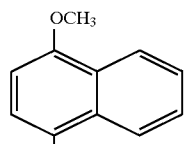 (PAG2-5)
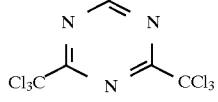 (PAG2-6)
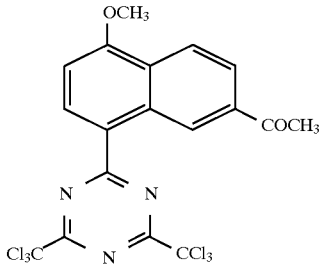 (PAG2-6)
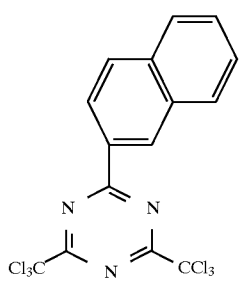 (PAG2-7)
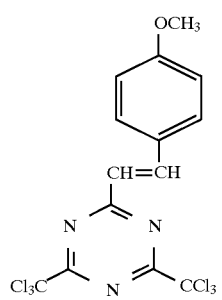 (PAG2-8)
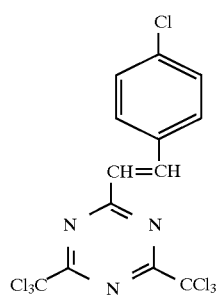 (PAG2-9)

-continued

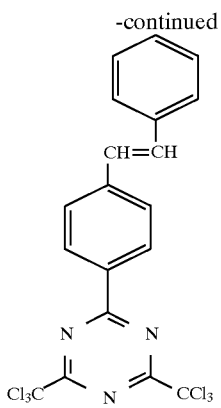
(PAG2-10)

(2) Iodonium salts represented by formula (PAG3) and solufonium salt represented by formula (PAG4)

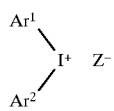
(PAG3)

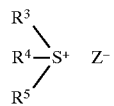
(PAG4)

wherein $Ar^1$ and $Ar^2$ each independently are a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group, and a halogen atom.

$R^3$, $R^4$, and $R^5$ each independently are a substituted or unsubstituted, alkyl group or aryl group, and preferably an aryl group having 6 to 14 carbon atoms, an alkyl group having 1 to 8 carbon atoms or a substituted derivative thereof. Preferred examples of the substituent which the aryl group can be substituted with include an alkoxy group having 1 to 8 carbon atoms, an alkyl group having 1 to 8 carbon atoms, a nitro group, a carboxyl group, a hydroxy group and a halogen atom, and preferred examples of the substitutent which the alkyl group can be substituted with include an alkoxy group having 1 to 8 carbon atoms, a carboxyl group and an alkoxycarbonyl group.

$Z^-$ represents an anion, and examples thereof include, but are not restricted to, $BF_4^-$, $AsF_6^-$, $PF_6^-$, $SbF_6^-$, $SiF_6^{2-}$, $ClO_4^-$, perfluoroalkane sulfonic anions such as $CF_3SO_3^-$, pentafluorobenzene sulfonic anion, condensed polynuclear aromatic sulfonic anions such as naphthalene-1-sulfonic anion, anthraquinone sulfonic anion, sulfonic acid group-containing dyestuffs, etc.

Two of $R^3$, $R^4$ and $R^5$, and $Ar^1$ and $Ar^2$ are independently a single bond or may be bonded via a substituent.

Typical examples include but are not restricted to:

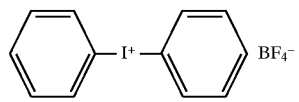
(PAG3-1)

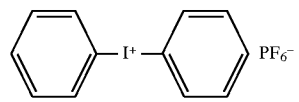
(PAG3-2)

-continued

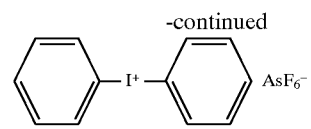
(PAG3-3)

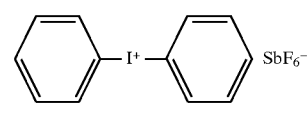
(PAG3-4)

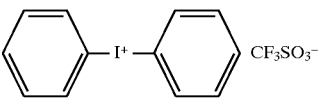
(PAG3-5)

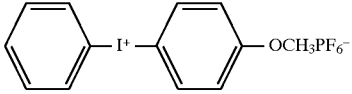
(PAG3-6)

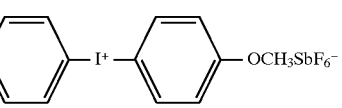
(PAG3-7)

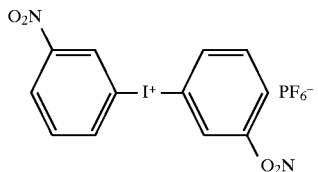
(PAG3-8)

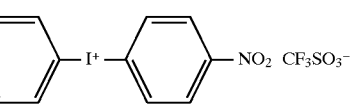
(PAG3-9)

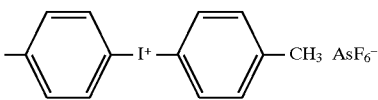
(PAG3-10)

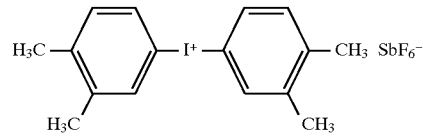
(PAG3-11)

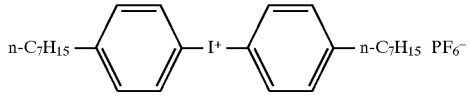
(PAG3-12)

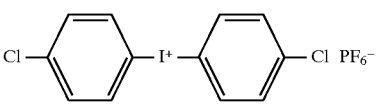
(PAG3-13)

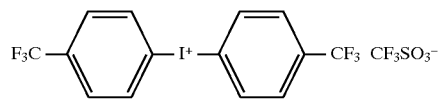
(PAG3-14)

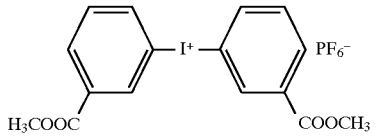
(PAG3-15)

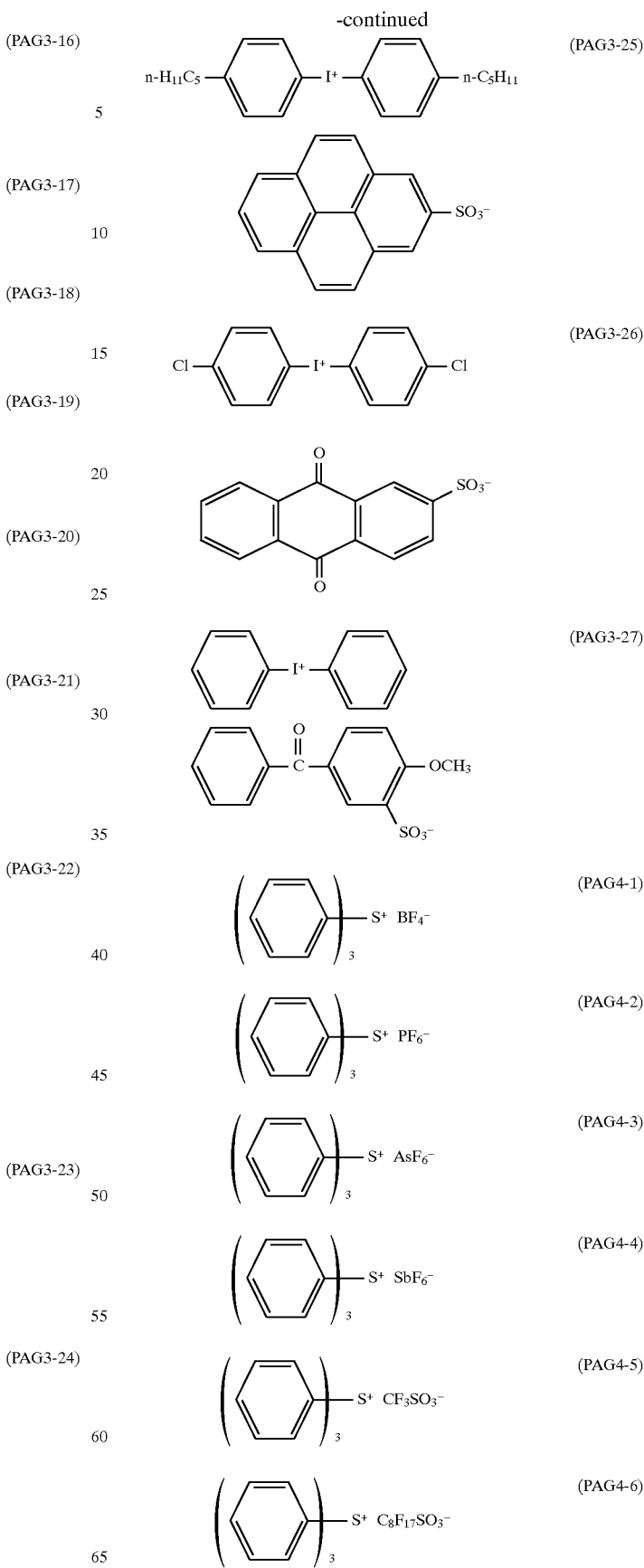

-continued
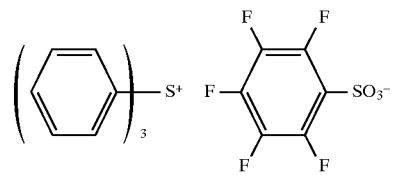 (PAG4-7)
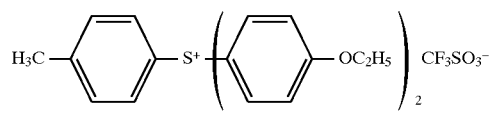 (PAG4-8)
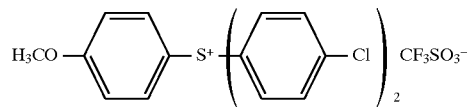 (PAG4-9)
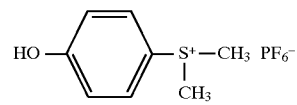 (PAG4-10)
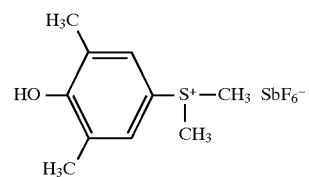 (PAG4-11)
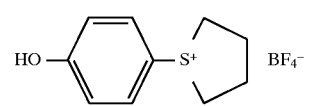 (PAG4-12)
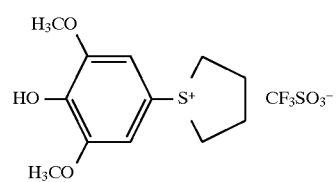 (PAG4-13)
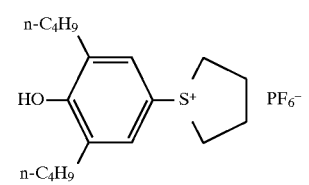 (PAG4-14)
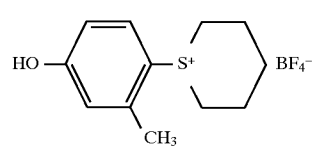 (PAG4-15)
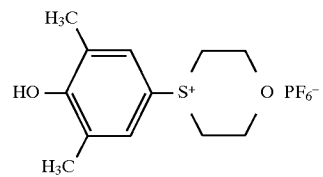 (PAG4-16)
-continued
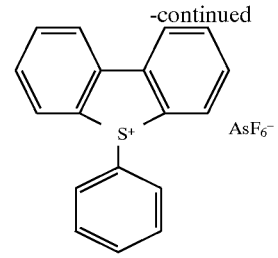 (PAG4-17)
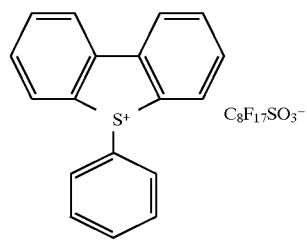 (PAG4-18)
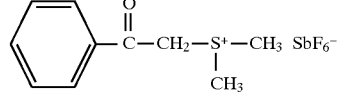 (PAG4-19)
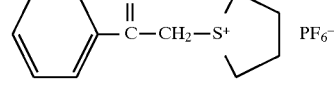 (PAG4-20)
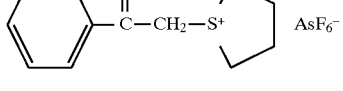 (PAG4-21)
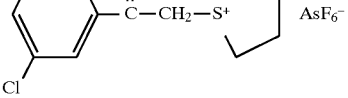 (PAG4-22)
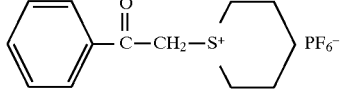 (PAG4-23)
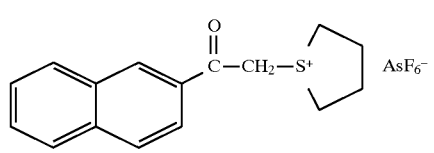 (PAG4-24)
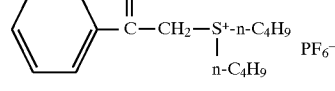 (PAG4-25)
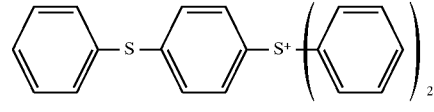 (PAG4-26)
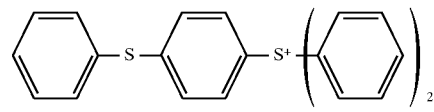 (PAG4-27)
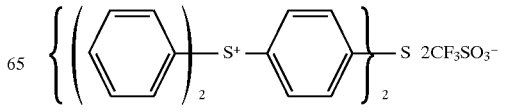 (PAG4-28)

-continued

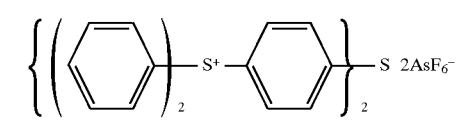 (PAG4-29)

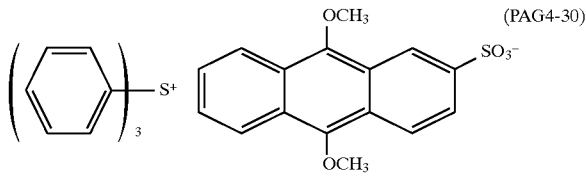 (PAG4-30)

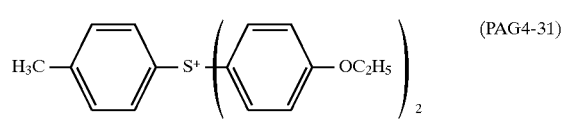 (PAG4-31)

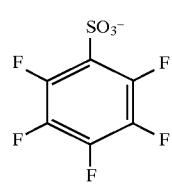

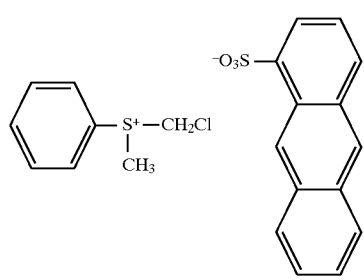 (PAG4-32)

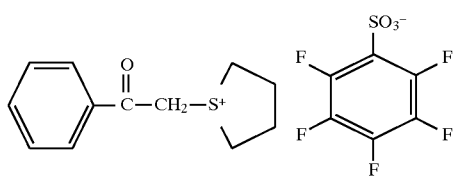 (PAG4-33)

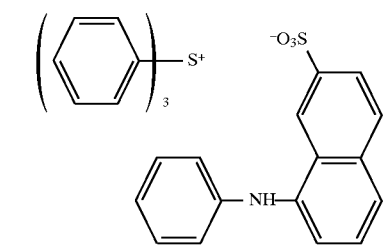 (PAG4-34)

The above-mentioned onium salts represented by formulae (PAG3) and (PAG4) are known and can be synthesized, for example, by a method described in J. W. Knapczyl et al., J. Am. Chem. Soc., 91, 145 (1969), A. L. Maycok et al., J. Org. Chem., 35, 2532, (1970), E. Goethas et al., Bull. Soc. Chem. Belg., 73, 546, (1964), H. M. Leicester, J. Am. Chem. Soc., 51, 3587 (1929), J. V. Crivello et al., J. Polym. Chem. Ed., 18, 2677 (1980), U.S. Pat. Nos. 2,807,648 and 4,247, 473, JP-A-53-101,331, etc.

(3) Disulfonic acid derivative represented by formula (PAG5) and iminosulfonate derivative represented by formula (PAG6)

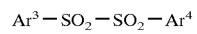 (PAG5)

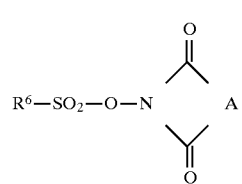 (PAG6)

wherein $Ar^3$ and $Ar^4$ are independently a substituted or unsubstituted aryl group, $R^6$ is a substituted or unsubstituted, alkyl group or aryl group, A is a substituted or unsubstituted, alkylene group, alkenylene group or arylene group.

Typical examples include, but are not restricted to:

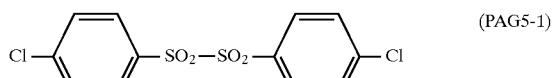 (PAG5-1)

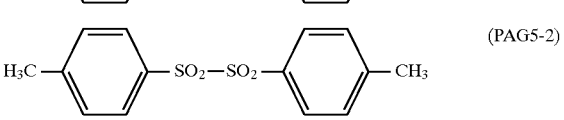 (PAG5-2)

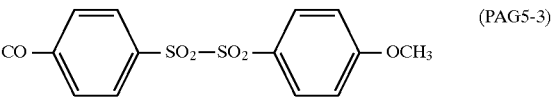 (PAG5-3)

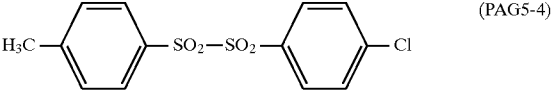 (PAG5-4)

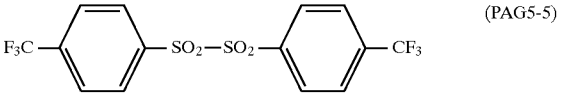 (PAG5-5)

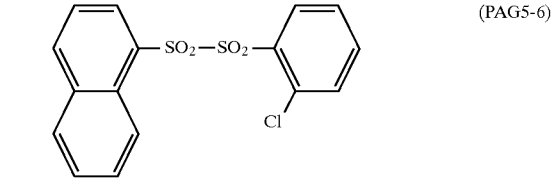 (PAG5-6)

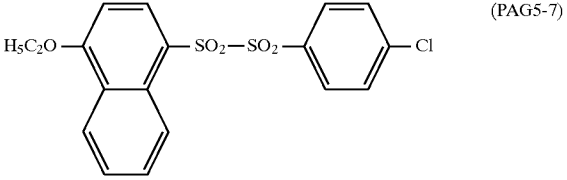 (PAG5-7)

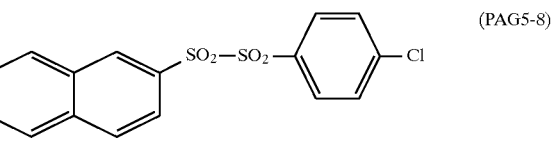 (PAG5-8)

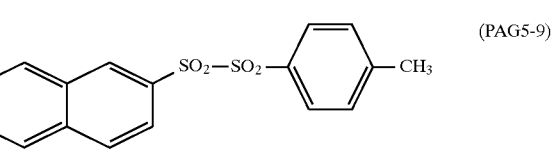 (PAG5-9)

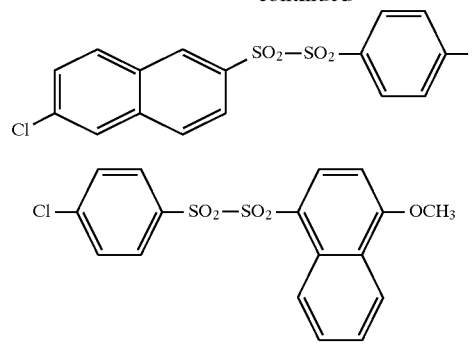
(PAG5-10)
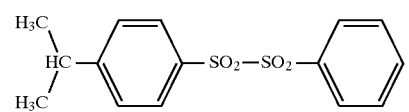
(PAG5-11)
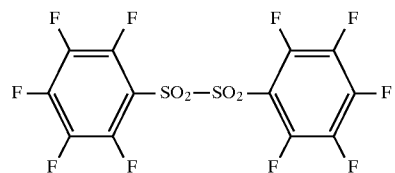
(PAG5-12)
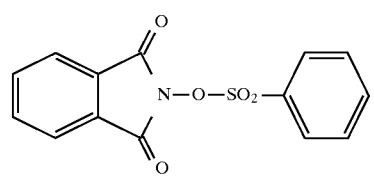
(PAG5-13)
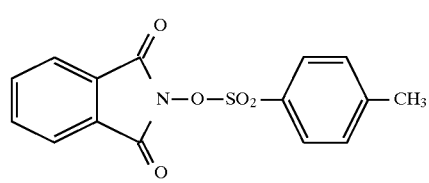
(PAG6-1)
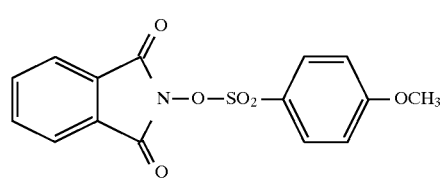
(PAG6-2)
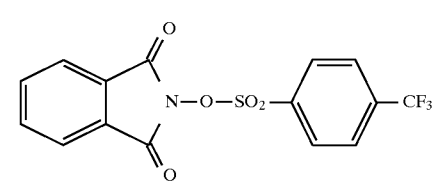
(PAG6-3)
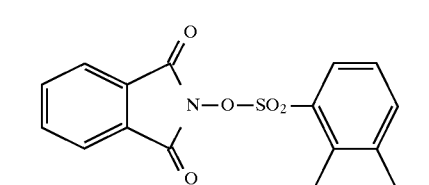
(PAG6-4)
(PAG6-5)
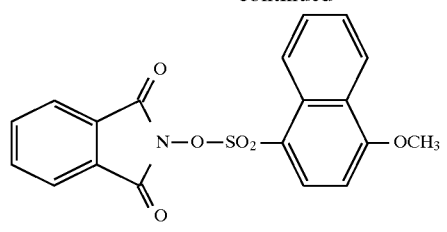
(PAG6-6)
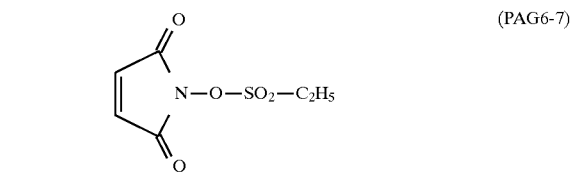
(PAG6-7)
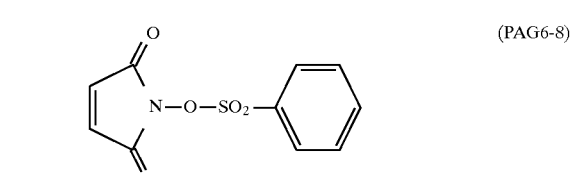
(PAG6-8)
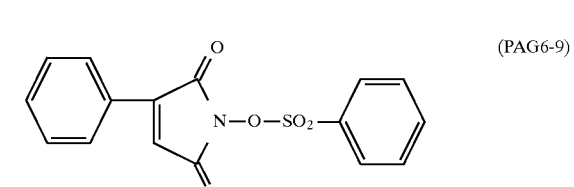
(PAG6-9)
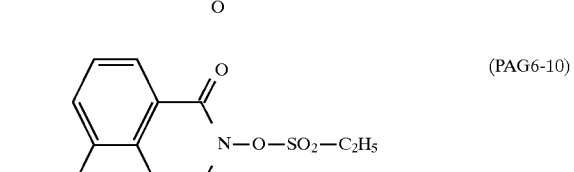
(PAG6-10)
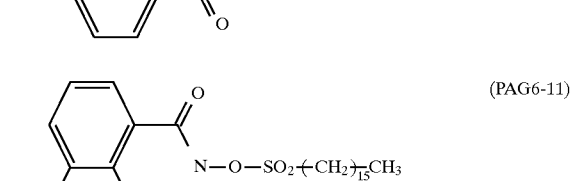
(PAG6-11)
(PAG6-12)
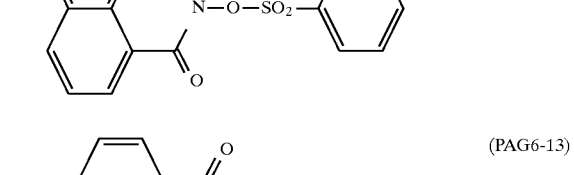
(PAG6-13)

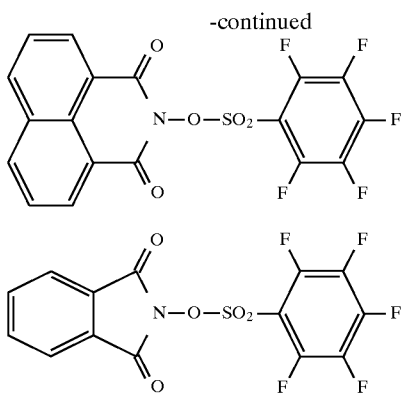

(PAG6-14)

(PAG6-15)

The amount of the compound which generates an acid with irradiation of an active ray or radiation is usually in the range of from 0.001 to 40% by weight, preferably from 0.01 to 20% by weight, and more preferably from 0.1 to 5% by weight, based on the total weight of the photosensitive composition (except for the solvent applied).

Optionally, a dyestuff, a pigment, a plasticizer, a surfactant, a photosensitizer, a compound containing at least two phenolic OH groups which accelerates a solubility in a developer, and an additive for preventing the deterioration in an image with the elapse of time from the exposure to the baking after the exposure may be additionally incorporated in the photosensitive composition of the present invention.

Suitable dyestuffs are oil dyestuffs and basic dyestuffs. Typical examples include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Kagaku Kogyo K.K.), Crystal Violet (CI 42555), Methyl Violet (CI 42535), Rhodamine B (CI 45170B), Malachite Green (CI 42000), Methylene Blue (CI 52015), etc.

When the spectral sensitizer described below is added so that the photo-acid generator is sensitized to a wavelength region longer than far infrared region, the photosensitive composition of the present invention can possess a sensitivity to an i or g ray. Suitable examples of the spectral sensitizer include, but are not restricted to, benzophenone, p,p'-tetramethyldiamino-benzophenone, p,p'-tetraethylethylamino-benzophenone, 2-chlorothioxanthone, anthrone, 9-ethoxyanthracene, anthracene, pyrene, perylene, phenothiazine, benzyl, acridine orange, benzoflavin, cetoflavin-T, 9,10-diphenylanthracene, 9-fluorenone, acetophenone, phenanthrene, 2-nitrofluorenone, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcumarin) and coronene.

The chemically amplified positive resist sometimes encounters the problems that with the elapse of time from the exposure to the baking after the exposure, the sensitivity is decreased, the profile becomes a so-called T-top state, and the line width is varied. In order to improve these problems, a compound containing a basic nitrogen element described in JP-A-5-165219, JP-A-5-173333, JP-A-5-289340, and JP-A-6-43650, an inclusion compound, or a compound containing a ketal or acetal group, may be added. It is needless to say that the compounds which can be added are not restricted thereto, if the object of the addition is met.

Typical examples of the compounds containing a basic nitrogen atom include, but are not restricted to, ammonia, triethylamine, tripropylamine, tributylamine, aniline, N-methylaniline, N,N-dimethylaniline, 2-methylaniline, 3-methylaniline, 4-methylaniline, 4-nitroaniline, 3,4'-diaminophenyl ether, 4,4'-diaminophenyl ether, 1-naphthylamine, 2-naphthylamine, diphenylamine, ethylenediamine, tetramethylenediamine, hexamethylenediamine, pyrrolidine, piperidine, imidazole, 4-methylimidazole, 4-methyl-2-phenylimidazole, thiabendazole, pyridine, 2-methylpyridine, 4-dimethylaminopyridine, 4-ethylpyridine, 1-methyl-4-phenylpyridine, 2-(1-ethylpropyl)pyridine, 2-hydroxypyridine, 3-hydroxypyridine, 4-hydroxypyridine, nicotinamide, dibenzoylthiamine, riboflavin tetrabutyrate, condensation product of dimethyl succinate-1-(2-hydroxyethy)-4-hydroxy-2,2,6,6-tetramethylpiperidine, poly{[6-(1,1,3,3-tetramethylbutyl)imino-1,3,5-triazin-2,4-diyl][(1,2,6,6-tetramethyl-4-piperidyl)imino] hexamethylene-[(2,2,6,6-tetramethyl-4-piperidyl)imino]}, 2-(3,5-di-t-butyl-4-hydroxybenzyl)-2-n-butylmalonate-bis (1,2,2,6,6-pentamethyl-4-piperidyl), 4,4'-diaminodiphenylmethane, 4,4'-diaminodiphenyl ether, 3,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane,2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, 2-aminobenzoic acid, 3-aminobenzoic acid, 4-aminobenzoic acid, 3-dimethylaminobenzoic acid, 4-dimethylaminobenzoic acid, methyl 3-aminobenzoate, ethyl 3-aminobenzoate, methyl 4-aminobenzoate, ethyl 3-aminobenzoate, methyl 3-dimethylaminobenzoate, ethyl 3-dimethylaminobenzoate, methyl 4-dimethylaminobenzoate, ethyl 4-dimethylaminobenzoate, glycine, alanine, phenylalanine, and tryptophane.

Typical examples of inclusion compounds include, but are not restricted to, 2,6-di-o-methyl-α-cyclodextrin, 2,6-di-o-methyl-β-cyclodextrin, 2,6-di-o-methyl-γ-cyclodextrin, 2,6-di-o-methyl-δ-cyclodextrin, 2,6-di-o-ethyl-α-cyclodextrin, 2,6-di-o-ethyl-β-cyclodextrin, 2,6-di-n-butyl-β-cyclodextrin, 2,3,6-tri-o-methyl-α-cyclodextrin, 2,3,6-tri-o-methyl-β-cyclodextrin, 2,3,6-tri-o-methyl-γ-cyclodextrin, 2,3,6-tri-o-ethyl-β-cyclodextrin, o-carboxymethyl-o-methyl-α-cyclodextrin, o-carboxymethyl-o-methyl-β-cyclodextrin, o-carboxymethyl-o-methyl-γ-cyclodextrin, o-carboxyethyl-o-methyl-β-cyclodextrin, o-carboxymethyl-o-n-butyl-cyclodextrin, o-ethoxycarbonylmethyl-o-ethyl-β-cyclodextrin, o-carboxymethyl-o-ethyl-α-cyclodextrin, o-carboxymethyl-o-ethyl-β-cyclodextrin, o-carboxymethyl-o-ethyl-γ-cyclodextrin, o-carboxymethyl-α-cyclodextrin, o-carboxymethyl-β-cyclodextrin, o-carboxyethyl-β-cyclodextrin, o-(2,2-dimethoxy)ethyl-β-cyclodextrin, o-(2-methoxy)ethyl-β-cyclodextrin, o-methoxymethyl-β-cyclodextrin, etc.

Typical examples of the compounds containing an acetal or ketal group include, but are not restricted to, 1,4-di-o-tosyl-2,3-o-isopropylidene-L-threitol, oligoacetal, diacetone-D-glucose, 3-o-acetyl-6-o-benzoyl-5-o-(methylsulfonyl)-1,2-o-isopropylidene-α-D-glucofuranose, 1,2,3,4-di-o-isopropylidene-6-o-(trisulfonyl)-α-galactopyranose, 1,2,5,6-di-o-isopropylidene-3-o-(paratolylsulfonyl)-α-D-allofuranose, 1,2-o-isopropylidene-6-o-(paratolylsulfonyl)-β-L-ide-furanose,2,2'-dimethyl-1,3-dioxolane-4-methanol, etc.

The photosensitive composition of the present invention is dissolved in a solvent which can dissolve the above components to be applied on a substrate. Preferred examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropinonate, ethyl ethoxypropinonate, methyl pyruvate, ethyl pyruvate, propyl pyruvate, N,N-dimethylformamide, dimethylsulfoxide, N-methylpyrolidone, tetrahydrofuran, etc. These solvents may be used singly or as a mixture of two or more thereof.

A surfactant may be added to the solvent. Typical examples include non-ionic surfactants, e.g., polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenol ether and polyoxyethylene nonylphenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine-containing surfactants such as F Top EF 301, EF 303, EF 352 (produced by Shinakitakasei K.K.), Megafuc F 171 and F173 (produced by Dainippon Ink Co., Ltd.) Florade FC 430 and FC 431 (produced by Sumitomo 3M Co., Ltd.), Asahi Guard AG 710, and Safron S-382, SC 101, SC 102, SC 103, SC 104, SC 105, and SC 106 (produced by Asahi Glass Co., Ltd.); organisiloxane polymer KP 341 (produced by Shin-Etsu Chemical Co., Ltd.) and acrylic or methacrylic (co)polyflow No. 75, and No. 95 (produced by Kyoei Yushi Kagaku Kogyo K.K.), etc. The amount of surfactant formulated is usually not more than 2 parts by weight, preferably not more than 1 part by weight, based on 100 parts by weight of the solid content in the composition of the present invention.

The surfactant may be added singly or in combination of two or more thereof.

The photosensitive composition described above can e applied on a substrate such as used in the production of an accurate integrated circuit device by an appropriate applying method such as by means of a spinner or coater, and exposed through a prescribed mask, and baked to be developed. This can provide a good resist pattern.

A developer for the photosensitive composition of the present invention which can be used is an aqueous solution of an alkali e,g, an inorganic alkali such as sodium hydroxide, potassium hydroxide, sodium carbonate, sodium silicate, sodium methasilicate, or aqueous ammonia, a primary amine such as ethylamine or n-propylamine, a secondary amine such as diethylamine or di-n-butylamine, a tertiary amine such as triethylamine or methyldiethylamine, an alcohol amine such as dimethylethanol amine or triethanol amine, a quaternary ammonium salt such as tetramethylammonium hydroxide or tetraethylammonium hydroxide, or a cyclic amine such as pyrrole or piperidine. The concentration of the alkali expressed as normality is in the range of generally from 0.001 to 1N, preferably from 0.01 to 0.35N, and more preferably from 0.03 to 0.2N.

Moreover, an appropriate amount of an alcohol or a surfactant may be added to the aqueous alkali solution.

The chemically amplified positive photosensitive composition of the present invention containing a dissolution inhibitor of the present invention and an alkali-soluble resin has a high sensitivity, high resolution and good profile and excels in storage stability and heat resistance of the resist solution.

The present invention will now be described in greater detail by referring to Examples, but it should be understood that the present invention is never restricted to Examples.

EXPERIMENT A

Synthesis Example 1 of Dissolution Inhibitive Compound

To a solution of 19.2 g (0.040 mol) of $\alpha,\alpha',\alpha''$-tris(4-hydroxyphenyl)-1,3,5-triisopropylbenzene in 120 ml of N,N-dimethylacetamide, were added 21.2 g (0.15 mol) of potassium carbonate and 27.1 g (0.14 mol) of t-butyl bromoacetate, and the mixture was stirred at 120° C. for 7 hours. Thereafter, the reaction mixture was incorporated into 1.5 l of water, extracted with ethyl acetate, dried over magnesium sulfate, the extract was concentrated, and refined through column chromatography (carrier: silica gel, developer: ethyl acetate/n-hexane=3/7 (volume ratio)). This gave 30 g of a pale yellow viscose solid. NMR analysis confirmed that this was exemplified compound 31 (all R being $-CH_2-COO-C_4H_9{}'$). This is designated as dissolution inhibitor (a).

Synthesis Example 2 of Dissolution Inhibitive Compound

To a solution of 14.3 g (0.020 mol) of $\alpha,\alpha,\alpha',\alpha',\alpha'',\alpha''$-hexakis(4-hydroxyphenyl)-1,3,5-triethylbenzene in 120 ml of N,N-dimethylacetamide, were added 21.2 g (0.15 mol) of potassium carbonate and 27.1 g (0.14 mol) of t-butyl bromoacetate, and the mixture was stirred at 120° C. for 7 hours. Thereafter, the reaction mixture was incorporated into 1.5 l of water, extracted with ethyl acetate, dried over magnesium sulfate, the extract was concentrated, and refined through a column chromatography (carrier: silica gel, developer: ethyl acetate/n-hexane=2/8 (volume ratio)). This gave 24 g of a pale yellow viscose solid. NMR analysis confirmed that this was exemplified compound 62 (all R being $-CH_2-COO-C_4H_9{}'$). This is designated as dissolution inhibitor (b).

Synthesis Example 3 of Dissolution Inhibitive Compound

To a solution of 48.1 g (0.010 mol) of $\alpha,\alpha',\alpha''$-tris(4-hydroxyphenyl)-1,3,5-isotripropylbenzene in 300 ml of dimethylacetamide were added 22.1 g (0.16 mol) of potassium carbonate and 42.9 g (0.22 mol) of t-butyl bromoacetate, and the mixture was stirred at 120° C. for 5 hours. Thereafter, the reaction mixture was incorporated into 2 l of ion-exchanged water. The reaction mixture was neutralized with acetic acid and then extracted with ethyl acetate.

The ethyl acetate-extract was concentrated, and refined through a column chromatography (carrier: silica gel, developer: ethyl acetate/n-hexane =1/5 (volume ratio)) to obtain dissolution inhibitor (c) having the construction shown below:

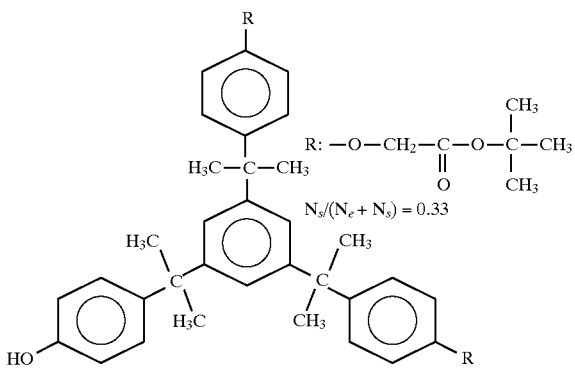

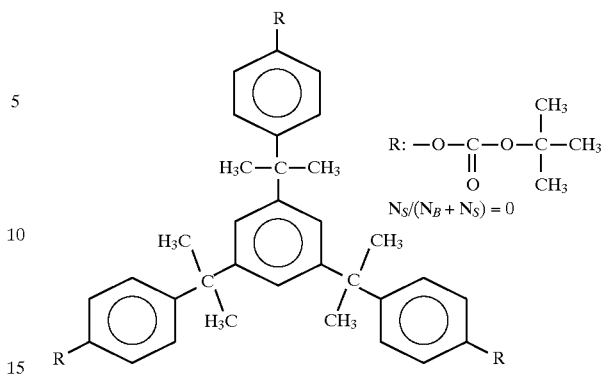

Synthesis of Comparative Dissolution Inhibitor (m)

Dissolution inhibitor (m) having the following structure was synthesized according to the process described in JP-A-2-248953.

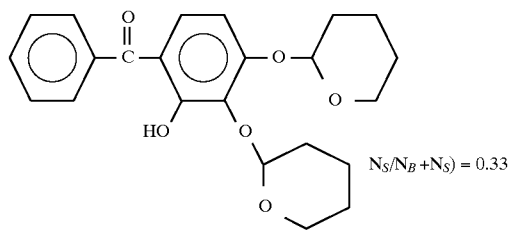

Synthesis Examples 4–11 of Dissolution Inhibitive Compound

Dissolution inhibitive compounds (d) to (k) having an acid-decomposable group, $-CH_2-COO-C_4H_9{}^t$, were synthesized similarly. The structures and $N_S/(N_B+N_S)$ values of these dissolution inhibitors are shown in Table 1.

TABLE 1 structure and $N_S/(N_B + N_S)$ of dissolution inhibitors

| Dissolution Inhibitor No. | Structure | $N_S/(N_B + N_S)$ |
|---|---|---|
| d | 7 | 0.15 |
| e | 12 | 0 |
| f | 18 | 0 |
| g | 19 | 0.10 |
| h | 40 | 0.15 |
| i | 44 | 0.10 |
| j | 60 | 0.15 |
| k | 62 | 0.25 |

Here, $N_S$ is the remaining phenolic OH group, and $N_B$ is the group, $-CH_2-COO-C_4H_9{}^t$. The number in the structure is number of the typically exemplified structure in the specification.

Synthesis of Comparative Dissolution Inhibitor (1)

In 400 ml of tetrahydrofuran (THF) was dissolved 20 g (0.042 mol) of α,α',α"-tris(4-hydroxyphenyl)-1,3,5-triisopropylbenzene. To this solution was added 14 g (0.125 mol) of potassium t-butoxy under a nitrogen atmosphere, stirred at room temperature for 10 minutes, and 29.2 g (0.13 mol) of di-t-butyl dicarbonate was added. The mixture was reacted at room temperature for 3 hours, and the reaction liquid was poured into ice water, and the reaction product was extracted with ethyl acetate.

The ethyl acetate-extract was concentrated, and refined through column chromatography (carrier: silica gel, developer: ethyl acetate/n-hexane=1/5 (volume ratio)). As a result, dissolution inhibitor (1) having the following structure was obtained.

Synthesis of Comparative Dissolution Inhibitor (n)

Dissolution inhibitor (n) having the following structure was synthesized according to the process described in European patent No. 249,139.

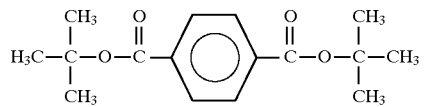

Synthesis Example 1 of Alkali-Soluble Resin of the Present Invention

In 120 ml of butyl acetate were dissolved 25.9 g (0.16 mol) of p-acetoxystyrene and 4.2 g (0.040 mol) of styrene, and 0.033 g of azobisbutylonitrile (AIBN) was added in an nitrogen atmosphere with stirring at 80° C. three times every 2 hours. Finally, the stirring was continued for 2 hours to carry out polymerization. The reaction liquid was introduced into 600 ml of hexane to separate a white resin.

The resulting resin was dried, and then dissolved in 150 ml of methanol. An aqueous solution comprising 7.7 g (0.19 mol) of sodium hydroxide and 50 ml of water was added to the resin, and the mixture was thermally refluxed for 3 hours to undergo hydrolysis. Thereafter, the mixture was diluted with 200 ml of water and neutralized with hydrochloric acid to separate a white resin.

The separated resin was filtered off, washed with water and dried to obtain 21 g of the resin. NMR analysis confirmed that the resin had a composition of p-hydroxystyrene/styrene=approximately 8/2, and GPC analysis confirmed that the weight average molecular weight of the resin was 27,000 (alkali-soluble resin (A) of the present invention).

Synthesis Example 2 of Alkali-Soluble Resin of the Present Invention

A white resin (21.5 g) was obtained in the same manner as in Synthesis Example 1, except for using 4.7 g (0.040 mol) of 4-methylstyrene in place of styrene. NMR analysis confirmed that the resin had a composition of p-hydroxystyrene/4-methylstyrene=approximately 8/2, and GPC analysis confirmed that the weight average molecular weight of the resin was 24,000 (alkali-soluble resin (B) of the present invention).

Synthesis Examples 3 to 8 of Alkali-Soluble Resins of the Present Invention

Alkali-soluble resins (C) to (H) of the present invention were synthesized similarly. The unit structures, proportion of composition (according to NMR), and the weight average molecular weight of these resin are shown in Table 2.

TABLE 2

Structure, Proportion of Composition and Weight Average Molecular Weight of Alkali-soluble Resin

| Alkali-Soluble Resin No. | Structure Unit | Proportion of Composition | Weight Average Molecular Weight |
|---|---|---|---|
| C | (A-1)(B-5) | 85/15 | 33,000 |
| D | (A-1)(B-9) | 80/20 | 12,000 |
| E | (A-2)(B-13) | 90/10 | 18,000 |
| F | (A-3)(B-12) | 80/20 | 23,000 |
| G | (A-1)(B-1)(D-1) | 60/20/20 | 24,000 |
| H | (A-1)(B-1)(E-1) | 60/20/20 | 28,000 |

In the unit structure in Table 2, the number represents the number of the typically exemplified unit structure (R=a hydrogen atom).

EXAMPLES 1 to 11

Resists were prepared using the compounds shown in Synthesis Examples. The formulations are shown in Table 3.

Comparative Example 1 to 3

Three-component resists were prepared using dissolution inhibitors (l) to (n). The formulations are shown in Table 3.

Comparative Example 4

A t-butoxycarbonyloxystyrene polymer was synthesized according to the process described in U.S. Pat. No. 4,491,628, which was used to prepare a two-component type positive resist. The formulation is shown in Table 3.

Comparative Example 5

A three-component resist was prepared using poly(p-hydroxystyrene). The formulation is shown in Table 3.

TABLE 3

Formulation of Photosensitive Composition

| | Alkali-Soluble Resin | | Photo-acid Generator | | Dissolution Inhibitor | |
|---|---|---|---|---|---|---|
| | | (g) | | (g) | | (g) |
| Example 1 | A | 1.5 | PAG4-3 | 0.05 | (a) | 0.5 |
| 2 | B | 1.5 | PAG4-3 | 0.05 | (b) | 0.5 |
| 3 | C | 1.5 | PAG4-5 | 0.05 | (c) | 0.5 |
| 4 | A | 1.5 | PAG4-7 | 0.05 | (d) | 0.5 |
| 5 | D | 1.5 | PAG5-12 | 0.05 | (e) | 0.5 |
| 6 | E | 1.5 | PAG5-13 | 0.05 | (f) | 0.5 |
| 7 | B | 1.5 | PAG4-5 | 0.05 | (g) | 0.5 |
| 8 | F | 1.5 | PAG6-14 | 0.05 | (h) | 0.5 |
| 9 | B | 1.5 | PAG4-6 | 0.05 | (i) | 0.5 |
| 10 | G | 1.5 | PAG4-3 | 0.05 | (j) | 0.5 |
| 11 | H | 1.5 | PAG4-3 | 0.05 | (k) | 0.5 |
| Comparative Example 1 | B | 1.5 | PAG4-3 | 0.05 | (1) | 0.5 |
| 2 | B | 1.5 | PAG4-3 | 0.05 | (m) | 0.5 |
| 3 | NVK | 1.5 | PAG4-3 | 0.05 | (n) | 0.5 |
| 4 | TBOCS | 1.0 | PAG4-3 | 0.1 | — | |
| 5 | PHS | 1.5 | PAG4-3 | 0.05 | (a) | 0.5 |

The abbreviations in Table 3 have the following meanings:

<Polymer>

NVK: m/p(45/55)-Cresol novolac resin (weight average molecular weight: 5,400)

PHS: Poly(p-hydroxystyrene) (weight average molecular weight: 31,000)

TBOCS: t-Butoxycarbonyloxystyrene polymer (number average molecular weight: 21,600)

Preparation of Photosensitive Composition and Evaluations

Each of composition was dissolved in 6 g of ziglime, filtered through a 0.2 $\mu$m filter to prepare a resist solution. The resist solution was applied on a silicon wafer using a spin coater at a rotation speed of 3000 rpm, dried on a vacuum-absorption type hot plate at 120° C. for 60 seconds to obtain a 1.0 $\mu$m thick resist film.

This resist film was subjected to exposure using 248 nm KrF excimer laser stepper (NA=0.55). After the exposure, the exposed resist film was heated on a vacuum absorption type hot plate at 100° C. for 60 seconds, and immediately thereafter soaked in an aqueous 0.26N tetramethylammonium hydroxide (TMAH) solution for 60 seconds, rinsed with water for 30 seconds, and then dried. The pattern thus obtained on the silicon wafer was observed with an electron-scanning microscope to evaluate the profile of the resist. The results are shown in Table 4.

The sensitivity is defined as a reciprocal of the amount of exposure reproducing the mask pattern of 0.70 $\mu$m and shown as a value relative to the sensitivity of Comparative Example 4.

The resolution represents a critical resolution at the amount of exposure reproducing the mask pattern of 0.70 $\mu$m.

With regard to the solubility in an applying solvent (storage stability), solutions of 1 g of an acid-decomposable dissolution inhibitor dissolved in 6 g of ECA (ethyl cellosolve acetate), EL (ethyl lactate), PEGMEA (propylene glycol monoethyl ether acetate), and MP (methyl-methoxy propionate), respectively were prepared, and stored under compulsion conditions at 40° C. for 20 days and the separation was evaluated. The absence of the separation is expressed as A and the presence of the separation is expressed as B and the results of the evaluation are shown in Table 4.

TABLE 4

Results of Evaluation

|  | Relative Sensitivity | Resolution (μm) | Profile of Resist | Solubility in Solvent (Storage Ability) | | | |
|---|---|---|---|---|---|---|---|
|  |  |  |  | ECA | EL | PEGMEA | MMP |
| Example 1 | 1.1 | 0.28 | Good | A | A | A | A |
| 2 | 1.1 | 0.26 | Good | A | A | A | A |
| 3 | 1.2 | 0.28 | Good | A | A | A | A |
| 4 | 1.3 | 0.28 | Good | A | A | A | A |
| 5 | 1.2 | 0.30 | Good | A | A | A | A |
| 6 | 1.1 | 0.30 | Good | A | A | A | A |
| 7 | 1.3 | 0.28 | Good | A | A | A | A |
| 8 | 1.2 | 0.30 | Good | A | A | A | A |
| 9 | 1.4 | 0.28 | Good | A | A | A | A |
| 10 | 1.3 | 0.26 | Good | A | A | A | A |
| 11 | 1.4 | 0.26 | Good | A | A | A | A |
| Comparative Example 1 | 0.9 | 0.28 | Good | B | B | B | B |
| 2 | 1.0 | 0.35 | Tapper | B | B | B | B |
| 3 | 0.7 | 0.40 | Tapper | B | B | B | B |
| 4 | 1.0 | 0.30 | Tapper | A | A | A | A |
| 5 | 1.2 | 0.32 | Slightly tapper | A | A | A | A |

From the results of Table 4, it was understood that the resist of the present invention had a high sensitivity, high resolution good profile and excelled in storage stability.

EXAMPLE 12

The resist films having the composition as shown in Example 1 (the present invention) and Comparative Example 1 in Table 1 were used to determine the decomposition temperatures of the dissolution inhibitors in the resists films, respectively by a differential thermal analysis and a thermogravimetric analysis. As a result, it was understood that whereas the decomposition temperature of dissolution inhibitor (1) according to Comparative Example was 128° C., the decomposition temperature of dissolution inhibitor (a) of the present invention was as high as 160° C. indicating that the dissolution inhibitor of the present invention excelled in heat resistance in the resist film.

EXPERIMENT B

Synthesis Example 9 of Alkali-Soluble Resin of the Present Invention

In 120 ml of butyl acetate were dissolved 25.9 g (0.16 mol) of p-acetoxystyrene and 5.4 g (0.040 mol) of p-methoxystyrene, and 0.033 g of azobisbutylonitrile (AIBN) was added in an nitrogen atmosphere with stirring at 80° C. three times every 2 hours. Finally, the stirring was continued for 2 hours to carry out polymerization. The reaction liquid was introduced into 600 ml of hexane to separate a white resin.

The resulting resin was dried, and then dissolved in 150 ml of methanol. An aqueous solution comprising 7.7 g (0.19 mol) of sodium hydroxide and 50 ml of water was added to the resin, and the mixture was thermally refluxed for 3 hours to undergo hydrolysis. Thereafter, the mixture was diluted with 200 ml of water and neutralized with hydrochloric acid to separate a white resin.

The separated resin was filtered off, washed with water and dried to obtain 23 g of the resin. NMR analysis confirmed that the resin had a composition of a substituted polystyrene having a ratio of p-substituted —OH group/—OCH$_3$=approximately 8/2, and GPC analysis confirmed that the weight average molecular weight of the resin was 31,000 (alkali-soluble resin (I) of the present invention).

Synthesis Example 10 of Alkali-Soluble Resin of the Present Invention

A white resin (24.0 g) was obtained in the same manner as in Synthesis Example 9, except for using 6.6 g (0.040 mol) of 2,4-dimethoxystyrene in place of p-methoxystyrene. NMR analysis confirmed that the resin had a composition of a substituted polystyrene having a structure ratio of p-OH group to 2,4-dimethoxy group=approximately 8/2, and GPC analysis confirmed that the weight average molecular weight of the resin was 26,000 (alkali-soluble resin (J) of the present invention).

Synthesis Example 11 of Alkali-Soluble Resin of the Present Invention

In 150 ml of pyridine was dissolved 24.0 g (0.20 mol) of poly(p-hydroxystyrene) (weight average molecular weight: 12,000), and 4.1 g (0.040 mol) of acetic anhydride was added dropwise thereto. After being stirred for 3 hours at 60° C., the mixture was incorporated in 2 l of water. The separated resin was washed with water, and then dried to obtain 23 g of resin. NMR analysis confirmed that the resin had a composition of a substituted polystyrene having a ratio of p-substituted —OH group/—O—CO—CH$_3$= approximately 8/2 (alkali-soluble resin (K) of the present invention).

Synthesis Examples 12 to 16 of Alkali-Soluble Resins of the Present Invention

Alkali-soluble resins (L) to (P) of the present invention were synthesized as in Synthesis Examples 9 to 11. The unit structures, proportion of composition (according to NMR), and the weight average molecular weight of these resin are shown in Table 5.

TABLE 5

Structure, Proportion of Composition and Weight Average Molecular Weight of Alkali-soluble Resin

| Alkali-Soluble Resin No. | Structure Unit | Proportion of Composition | Weight Average Molecular Weight |
|---|---|---|---|
| L | (A-1)(C-5) | 90/10 | 14,000 |
| M | (A-2)(C-2) | 80/20 | 22,000 |
| N | (A-3)(C-3) | 80/20 | 26,000 |
| O | (A-1)(C-12) | 80/20 | 18,000 |
| P | (A-9)(C-12) | 70/30 | 29,000 |

In the unit structure in Table 5, the number represents the number of the typically exemplified unit structure (R=a hydrogen atom).

EXAMPLES 13 to 23

Resists were prepared using the compounds shown in Synthesis Examples. The formulations are shown in Table 6.

Comparative Examples 6 to 8

Three-component resists were prepared using dissolution inhibitors (l) to (n). The formulations are shown in Table 6.

Comparative Example 9

A t-butoxycarbonyloxystyrene polymer was synthesized according to the process described in U.S. Pat. No. 4,491, 628, which was used to prepare a two-component type positive resist. The formulation is shown in Table 6.

Comparative Example 10

A three-component resist was prepared using poly(p-hydroxystyrene). The formulation is shown in Table 6.

TABLE 6

Formulation of Photosensitive Composition

| Example No. | Alkali-Soluble Resin | (g) | Photo-acid Generator | (g) | Dissolution Inhibitor | (g) |
|---|---|---|---|---|---|---|
| Example 13 | K | 1.5 | PAG4-3 | 0.05 | (a) | 0.5 |
| 14 | I | 1.5 | PAG4-3 | 0.05 | (b) | 0.5 |
| 15 | J | 1.5 | PAG4-5 | 0.05 | (c) | 0.5 |
| 16 | K | 1.5 | PAG4-7 | 0.05 | (d) | 0.5 |
| 17 | L | 1.5 | PAG5-12 | 0.05 | (e) | 0.5 |
| 18 | O | 1.5 | PAG5-13 | 0.05 | (f) | 0.5 |
| 19 | P | 1.5 | PAG4-5 | 0.05 | (g) | 0.5 |
| 20 | J | 1.5 | PAG6-14 | 0.05 | (h) | 0.5 |
| 21 | L | 1.5 | PAG4-6 | 0.05 | (i) | 0.5 |
| 22 | M | 1.5 | PAG4-3 | 0.05 | (j) | 0.5 |
| 23 | N | 1.5 | PAG4-3 | 0.05 | (k) | 0.5 |
| Comparative Example 6 | K | 1.5 | PAG4-3 | 0.05 | (l) | 0.5 |
| 7 | K | 1.5 | PAG4-3 | 0.05 | (m) | 0.5 |
| 8 | NVK | 1.5 | PAG4-3 | 0.05 | (n) | 0.5 |
| 9 | TBOCS | 1.0 | PAG4-3 | 0.1 | — | |
| 10 | PHS | 1.5 | PAG4-3 | 0.05 | (a) | 0.5 |

The abbreviations in Table 6 have the same meanings as those in Table 3.

Photosensitive compositions were prepared and evaluated as in Experiment A. The results are shown in Table 7. The sensitivity is defined as a reciprocal of the amount of exposure reproducing the mask pattern of 0.70 μm and shown as a value relative to the sensitivity of Comparative Example 9.

From the results of Table 7, it was understood that the resists of the present invention had a high sensitivity, high resolution and good profile, and excelled in storage stability.

TABLE 7

Results of Evaluation

| Example No. | Relative Sensitivity | Resolution (μm) | Profile of Resist | Solubility in Solvent (Storage Ability) | | | |
|---|---|---|---|---|---|---|---|
| | | | | ECA | EL | PEGMEA | MMP |
| Example 13 | 1.1 | 0.28 | Good | A | A | A | A |
| 14 | 1.1 | 0.28 | Good | A | A | A | A |
| 15 | 1.4 | 0.26 | Good | A | A | A | A |
| 16 | 1.3 | 0.26 | Good | A | A | A | A |
| 17 | 1.1 | 0.30 | Good | A | A | A | A |
| 18 | 1.1 | 0.30 | Good | A | A | A | A |
| 19 | 1.2 | 0.28 | Good | A | A | A | A |
| 20 | 1.2 | 0.30 | Good | A | A | A | A |
| 21 | 1.4 | 0.26 | Good | A | A | A | A |
| 22 | 1.3 | 0.26 | Good | A | A | A | A |
| 23 | 1.4 | 0.26 | Good | A | A | A | A |
| Comparative Example 6 | 0.9 | 0.28 | Good | B | B | B | B |
| 7 | 1.0 | 0.35 | Tapper | B | B | B | B |
| 8 | 0.7 | 0.40 | Tapper | B | B | B | B |
| 9 | 1.0 | 0.30 | Tapper | A | A | A | A |
| 10 | 1.2 | 0.32 | Slightly tapper | A | A | A | A |

EXAMPLE 24

The resist films having the composition as shown in Example 13 (the present invention) and Comparative Example 6 in Table 7 were used to determine the decomposition temperatures of the dissolution inhibitors in the resists films, respectively by a differential thermal analysis and a thermogravimetric analysis. As a result, it was understood that whereas the decomposition temperature of dissolution inhibitor (l) according to Comparative Example was 128° C., the decomposition temperature of dissolution inhibitor (a) of the present invention was as high as 160° C. indicating that the dissolution inhibitor of the present invention excelled in heat resistance in the resist film.

EXPERIMENT C

Synthesis Example 17 of Alkali-Soluble Resin of the Present Invention

In 120 ml of butyl acetate were dissolved 16.2 g (0.10 mol) of p-acetoxystyrene and 16.2 g (0.10 mol) of m-acetoxystyrene, and 0.033 g of azobisbutylonitrile (AIBN) was added in an nitrogen atmosphere with stirring at 80° C. three times every 2 hours. Finally, the stirring was continued for 2 hours to carry out polymerization. The reaction liquid was introduced into 600 ml of hexane to separate a white resin.

The resulting resin was dried, and then dissolved in 150 ml of methanol. An aqueous solution comprising 9.6 g (0.24 mol) of sodium hydroxide and 50 ml of water was added to the resin, and the mixture was thermally refluxed for 3 hours to undergo hydrolysis. Thereafter, the mixture was diluted with 200 ml of water and neutralized with hydrochloric acid to separate a white resin.

The separated resin was filtered off, washed with water and dried to obtain 22 g of the resin. NMR analysis confirmed that the resin had a composition of a poly (hydroxystyrene) having a p/m (para/meth) ratio of approximately 1/1, and GPC analysis confirmed that the weight average molecular weight of the resin was 28,000 (alkali-soluble resin (Q) of the present invention).

Synthesis Example 18 of Alkali-Soluble Resin of the Present Invention

A white resin (22.5 g) was obtained in the same manner as in Synthesis Example 17, except for using 16.2 g (0.10 mol) of o-acetoxystyrene in place of m-acetoxystyrene. NMR analysis confirmed that the resin had a composition of a substituted polystyrene having a composition of a poly (hydroxystyrene) having a p/o (para/ortho) ratio of approximately 1/1, and GPC analysis confirmed that the weight average molecular weight of the resin was 25,000 (alkali-soluble resin (R) of the present invention).

Synthesis Examples 19 to 24 of Alkali-Soluble Resins of the Present Invention

Alkali-soluble resins (S) to (X) of the present invention were synthesized similarly. The unit structures, proportion of composition (according to NMR), and the weight average molecular weight of these resin are shown in Table 8.

TABLE 8

Structure, Proportion of Composition and Weight Average Molecular Weight of Alkali-soluble Resin

| Alkali-Soluble Resin No. | Structure Unit | Proportion of Composition | Weight Average Molecular Weight |
|---|---|---|---|
| S | (A-1)(D-2) | 60/40 | 21,000 |
| T | (A-1)(D-3) | 70/30 | 27,000 |
| U | (A-2)(D-1) | 50/50 | 16,000 |
| V | (A-4)(D-1) | 50/50 | 14,000 |
| W | (A-1)(E-2) | 60/40 | 28,000 |
| X | (A-3)(E-1) | 70/30 | 22,000 |

In the unit structure in Table 8, the number represents the number of the typically exemplified unit structure (R=a hydrogen atom).

EXAMPLES 25 to 35

Resists were prepared using the compounds shown in Synthesis Examples. The formulations are shown in Table 9.

Comparative Examples 11 to 13

Three-component resists were prepared using dissolution inhibitors (l) to (n). The formulations are shown in Table 9.

Comparative Example 14

A t-butoxycarbonyloxystyrene polymer was synthesized according to the process described in U.S. Pat. No. 4,491,628, which was used to prepare a two-component type positive resist. The formulation is shown in Table 9.

Comparative Example 15 to 17

Resists were prepared by blending one or mixture of homopolymers, poly(p-hydroxystyrene), poly(m-hydroxystyrene) and poly(o-hydroxystyrene) with a dissolution inhibitor of the present invention. The formulations are shown in Table 9.

TABLE 9

Formulation of Photosensitive Composition

| Example No. | Alkali-Soluble Resin | (g) | Photo-acid Generator | (g) | Dissolution Inhibitor | (g) |
|---|---|---|---|---|---|---|
| Example 25 | Q | 1.5 | PAG4-3 | 0.05 | (a) | 0.5 |
| 26 | R | 1.5 | PAG4-3 | 0.05 | (b) | 0.5 |
| 27 | Q | 1.5 | PAG4-5 | 0.05 | (c) | 0.5 |
| 28 | S | 1.5 | PAG4-7 | 0.05 | (d) | 0.5 |
| 29 | U | 1.5 | PAG5-12 | 0.05 | (e) | 0.5 |
| 30 | V | 1.5 | PAG5-13 | 0.05 | (f) | 0.5 |
| 31 | T | 1.5 | PAG4-5 | 0.05 | (g) | 0.5 |
| 32 | X | 1.5 | PAG6-14 | 0.05 | (h) | 0.5 |
| 33 | W | 1.5 | PAG4-6 | 0.05 | (i) | 0.5 |
| 34 | R | 1.5 | PAG4-3 | 0.05 | (j) | 0.5 |
| 35 | V | 1.5 | PAG4-3 | 0.05 | (k) | 0.5 |
| Comparative Example 11 | Q | 1.5 | PAG4-3 | 0.05 | (l) | 0.5 |
| 12 | Q | 1.5 | PAG4-3 | 0.05 | (m) | 0.5 |
| 13 | NVK | 1.5 | PAG4-3 | 0.05 | (n) | 0.5 |
| 14 | TBOCS | 1.0 | PAG4-3 | 0.1 | — | |
| 15 | p-PHS/m-PHS (1/1) | 1.5 | PAG4-3 | 0.05 | (a) | 0.5 |
| 16 | p-PHS/o-PHS (1/1) | 1.5 | PAG4-3 | 0.05 | (b) | 0.5 |
| 17 | p-PHS | 1.5 | PAG4-3 | 0.05 | (a) | 0.5 |

The abbreviations in Table 9 have the following meanings:

<Polymer>

NVK: m/p(45/55)-Cresol novolac resin (weight average molecular weight: 5,400)

p-PHS: Poly(p-hydroxystyrene) (weight average molecular weight: 31,000)

m-PHS: Poly(m-hydroxystyrene) (weight average molecular weight: 22,000)

o-PHS: Poly(o-hydroxystyrene) (weight average molecular weight: 24,000)

TBOCS: t-Butoxycarbonyloxystyrene polymer (number average molecular weight: 21,600)

Photosensitive compositions were prepared and evaluated as in Experiment A. The results are shown in Table 10. The sensitivity is defined as a reciprocal of the amount of exposure reproducing the mask pattern of 0.70 μm and shown as a value relative to the sensitivity of Comparative Example 14.

From the results of Table 10, it was understood that the resists of the present invention had a high sensitivity, high resolution and good profile, and excelled in storage stability.

TABLE 10

Results of Evaluation

| Example No. | Relative Sensitivity | Resolution (μm) | Profile of Resist | Solubility in Solvent (Storage Ability) | | | |
|---|---|---|---|---|---|---|---|
| | | | | ECA | EL | PEGMEA | MMP |
| Example 25 | 1.2 | 0.25 | Good | A | A | A | A |
| 26 | 1.2 | 0.25 | Good | A | A | A | A |
| 27 | 1.6 | 0.24 | Good | A | A | A | A |
| 28 | 1.2 | 0.24 | Good | A | A | A | A |
| 29 | 1.1 | 0.28 | Good | A | A | A | A |
| 30 | 1.1 | 0.28 | Good | A | A | A | A |
| 31 | 1.3 | 0.26 | Good | A | A | A | A |
| 32 | 1.3 | 0.28 | Good | A | A | A | A |
| 33 | 1.4 | 0.25 | Good | A | A | A | A |
| 34 | 1.5 | 0.24 | Good | A | A | A | A |
| 35 | 1.4 | 0.25 | Good | A | A | A | A |
| Comparative Example 11 | 0.9 | 0.28 | Good | B | B | B | B |
| 12 | 1.0 | 0.35 | Tapper | B | B | B | B |
| 13 | 0.7 | 0.40 | Tapper | B | B | B | B |
| 14 | 1.0 | 0.30 | Tapper | A | A | A | A |
| 15 | 1.1 | 0.28 | Slightly tapper | A | A | A | A |
| 16 | 1.1 | 0.28 | Slightly tapper | A | A | A | A |
| 17 | 1.2 | 0.32 | Slightly tapper | A | A | A | A |

EXAMPLE 36

The resist films having the composition as shown in Example 25 (the present invention) and Comparative Example 11 in Table 10 were used to determine the decomposition temperatures of the dissolution inhibitors in the resists films, respectively by a differential thermal analysis and a thermogravimetric analysis. As a result, it was understood that whereas the decomposition temperature of dissolution inhibitor (l) according to Comparative Example was 128° C., the decomposition temperature of dissolution inhibitor (a) of the present invention was as high as 160° C. indicating that the dissolution inhibitor of the present invention excelled in heat resistance in the resist film.

While the invention has been described in detail with reference to specific embodiments, it will be apparent to one skilled in the art that various changes and modifications can be made to the invention without departing from its spirit and scope.

What is claimed is:

1. A positive photosensitive composition comprising:
   (a) a resin insoluble in water and soluble in an aqueous alkali solution, the resin containing a structure unit represented by formula (A) and at least one structure unit represented by formulae (B) to (E):

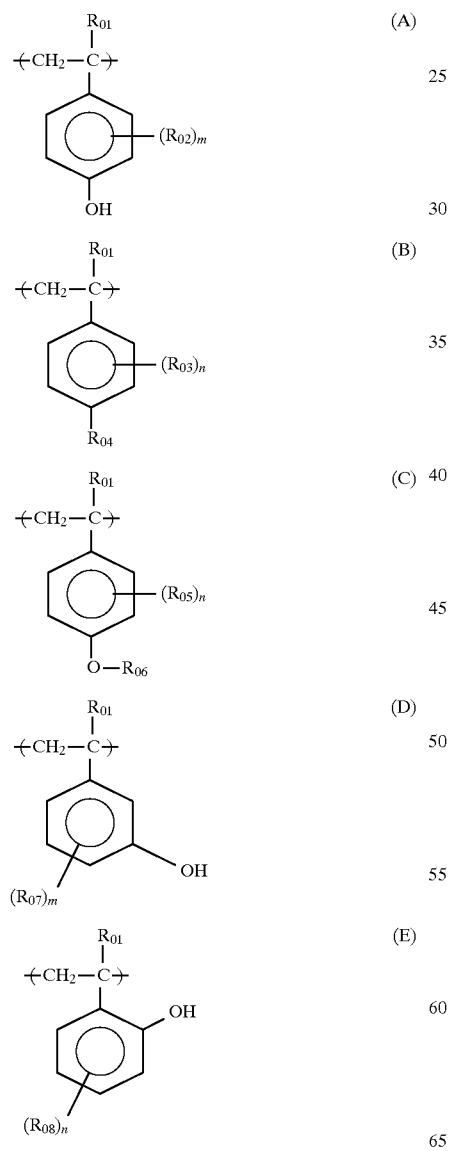

wherein, $R_{01}$ represents a hydrogen atom or a methyl group; $R_{02}$ each independently represents a hydrogen atom, an alkyl group, a cycloalkyl group which may possess a substituent, an alkoxy group which may possess a substituent, a hydroxy group, a cyano group, a nitro group, or a halogen atom, $R_{03}$ each independently represents a hydrogen atom, an alkyl group which may possess a substituent, a cycloalkyl group which may possess a substituent, an alkoxy group which may possess a substituent, a cyano group, a nitro group, or a halogen atom, $R_{04}$ represents a hydrogen atom, an alkyl group which may possess a substituent, a cycloalkyl group which may possess a substituent, an aryl group which may possess a substituent, a cyano group, a nitro group, or a halogen atom, $R_{05}$ each independently represents a hydrogen atom, an alkyl group which may possess a substituent, a cycloalkyl group which may possess a substituent, an alkoxy group which may possess a substituent, a hydroxy group, a cyano group, a nitro group, or a halogen atom, $R_{06}$ represents an alkyl group which may possess a substituent or an acyl group which may possess a substituent, $R_{07}$ and $R_{08}$ each independently represents a hydrogen atom, an alkyl group which may possess a substituent, a cycloalkyl group which may possess a substituent, an alkoxy group which may possess a substituent, a hydroxy group, a cyano group, a nitro group or a halogen atom, m and n are independently 0 or an integer of from 1 to 3, and a plurality of $R_{02}$, $R_{03}$, $R_{05}$, $R_{07}$ or $R_{08}$ may be the same or different;

(b) a compound which generates an acid with irradiation of an active ray or radiation; and (c) a low molecular weight acid-decomposable dissolution inhibitor having a molecular weight of not more than 3000, which possesses a tertiary alkyl ester group and whose solubility in an aqueous alkali solution is increased by the action of acid;

wherein compound (c) is at least one compound selected from the group consisting of:
   (i) a compound having at least two tertiary alkyl ester groups, in which the longest distance with respect to the distance between two tertiary ester groups selected arbitrarily comprises at least 10 bonding atoms except for the atoms contained in the ester groups, and
   (ii) a compound having at least three tertiary alkyl ester groups, in which the longest distance with respect to the distance between two tertiary ester groups selected arbitrarily comprises at least 9 bonding atoms except for the atoms contained in the ester groups;

and wherein said compound (c) is represented by at least one of the following formula (VI), (VII), (VIII), (XII), (XIII), (XV), (XVI), (XVII), (XVIII), (XIX) or (XX):

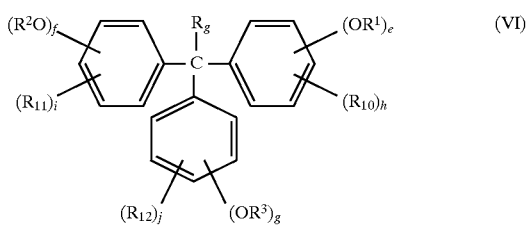

-continued

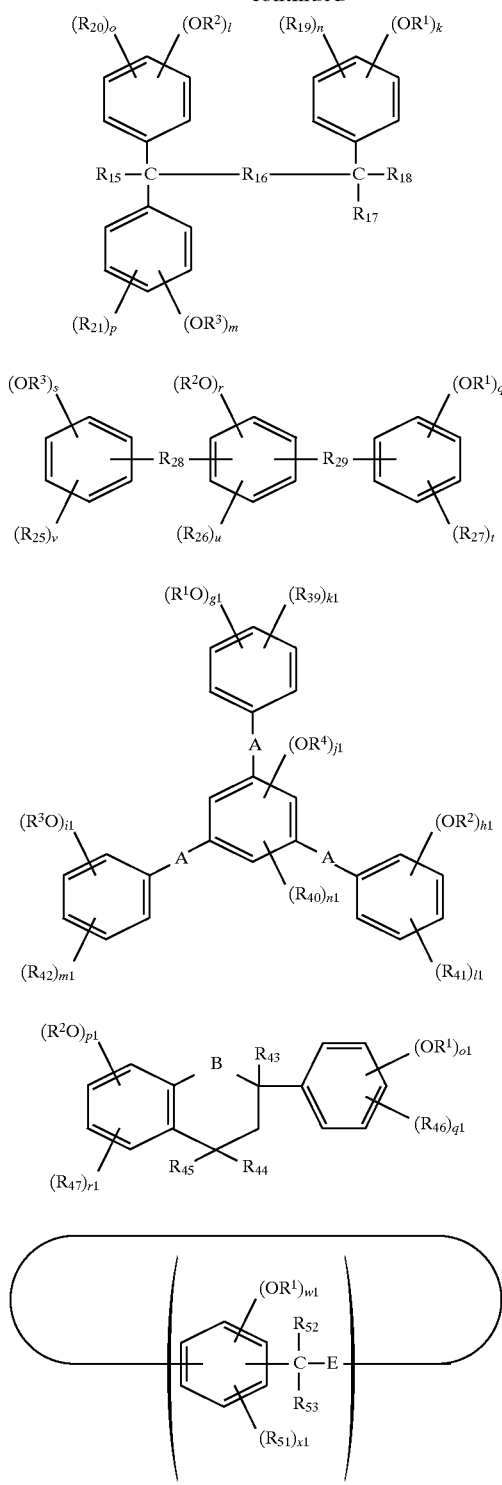

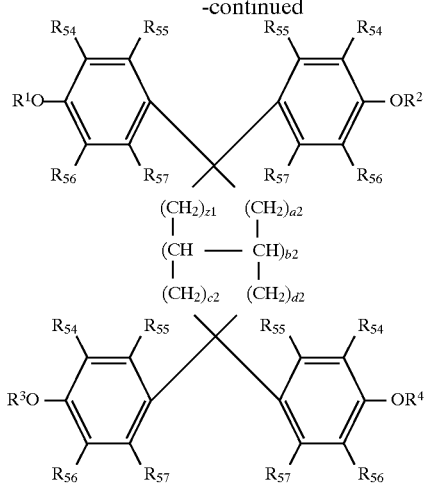

wherein:
$R^1$, $R^2$, $R^3$ and $R^4$ may be the same or different and are a hydrogen atom or —$R^0$—COO—C($R^{01}$) ($R^{02}$) ($R^{03}$); wherein $R^{01}$, $R^{02}$ and $R^{03}$ may be the same or different and are an alkyl group, a cycloalkyl group or an alkenyl group; two of $R^{01}$ to $R^{03}$ may be bonded to form a ring; and R is a bi- or multi-valent aliphatic or aromatic hydrocarbon group;

$R_9$ to $R_{12}$, $R_{15}$, $R_{17}$ to $R_{21}$, $R_{25}$ to $R_{27}$, $R_{39}$ to $R_{42}$, $R_{46}$ to $R_{47}$, and $R_{51}$ may be the same or different and are a hydrogen atom, a hydroxyl group, an alkyl group, an alkoxy group, an acyl group, an acyloxy group, an aryl group, an aryloxy group, an aralkyl group, an aralkyloxy group, a halogen atom, a nitro group, a carboxyl group, a cyano group, or —N($R_{13}$)($R_{14}$);

where $R_{13}$ and $R_{14}$ are independently a hydrogen atom, an alkyl group or an aryl group;

$R_{16}$ is a single bond, an alkylene group or

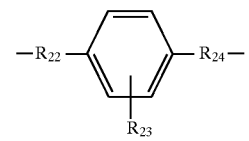

$R_{22}$ and $R_{24}$ may be the same or different and are a single bond, an alkylene group, —O—, —S—, —CO—, or a carboxyl group;

$R_{23}$ is a hydrogen atom, an alkyl group, an alkoxy group, an acyl group, an acyloxy group, an aryl group, a nitro group, a hydroxy group, a cyano group, or a carboxyl group, where the hydroxy group may be substituted with a t-butoxycarbonyl group;

$R_{28}$ and $R_{29}$ may be the same or different and are a methylene group, a lower alkyl-substituted methylene group, a halomethylene group, or a haloalkyl group;

$R_{43}$ to $R_{45}$ may be the same or different and are a hydrogen atom, an alkyl group, an alkoxy group, an acyl group, or an acyloxy group;

$R_{52}$ and $R_{53}$ may be the same or different and are a hydrogen atom, a lower alkyl group, a lower haloalkyl group or an aryl group;

$R_{54}$ to $R_{57}$ may be the same or different and are a hydrogen atom, a hydroxyl group, a halogen atom, a nitro group, a cyano group, a carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group or an aryloxycarbonyl group, provided that the four substituents represented by the same symbol may be the same or different;

B is a single bond or —O—;

A is a ethylene group, a lower alkyl-substituted methylene group, a halomethylene group or a haloalkyl group;

E is a single bond or oxymethylene group;

when e to v, $g_1$ to $y_1$ are two or more, the group in the parentheses may be the same or different;

e to q, s, t, v, $q_1$ to $i_1$, $k_1$, to $m_1$, $o_1$ and $q_1$, are independently 0 or an integer of 1 to 5;

r, u, $p_1$, $r_1$, $w_1$, $x_1$, are independently 0 or an integer of 1 to 4;

$j_1$, $n_1$, $z_1$, $a_2$, $b_2$, $c_2$, and $d_2$ are independently 0 or an integer of 1 to 3, provided that at least one of $z_1$, $a_2$, $c_2$ and $d_2$ is 1 or more;

$y_1$ is an integer of 3 to 8;

(a+b), (e+f+g), (k+l+m), (q+r+s), $(g_1+h_1+i_1+j_1)$ and $(o_1+p_1)$, $\geq 2$;

$j_1+n_1 \leq 3$;

(r+u), $(p_1+r_1)$, and $(x_1+w_1) \leq 4$; and (e+h), (f+i), (g+j), (k+n), (l+o), (m+p), (q+t), (s+v), $(g_1+k_1)$, $(h_1+l_1)$, $(i_1+m_1)$, and $(o_1+g_1) \leq 5$;

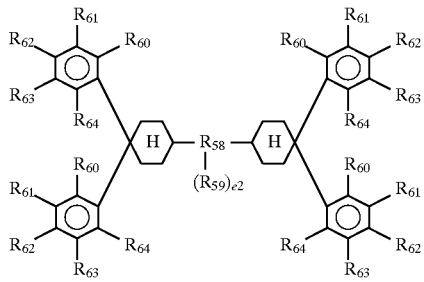

(XVII)

wherein:

$R_{53}$ is an organic group, a single bond, —S—, —SO—, or

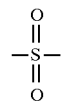

$R_{59}$ is a hydrogen atom, a monovalent organic group or

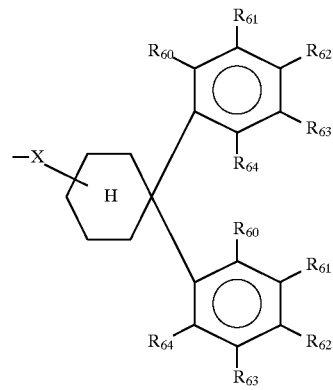

where $R_{60}$ to $R_{64}$ may the same or different and are a hydrogen atom, a hydroxy group, a halogen atom, an alkyl group, an alkoxy group, an alkenyl group or —O—R$^0$—COO—C(R$^{01}$)(R$^{02}$)(R$^{03}$); provided that at least two of $R_{60}$ to $R_{64}$ are the group, —O—R$^0$—COO—C(R$^{01}$)(R$^{02}$)(R$^{03}$); and each 4 to 6 substituents represented by the same symbol may be the same or different; and X is a divalent organic group; and $e_2$ is 0 or 1;

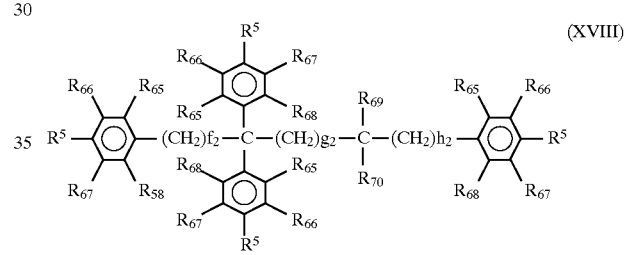

(XVIII)

wherein:

$R_{65}$ to $R_{68}$ may be the same or different and are a hydrogen atom, a hydroxy group, a halogen atom, an alkyl group, an alkoxy group, or an alkenyl group; provided that each 4 to 6 substituents represented by the same symbol may be the same or different; $R_{69}$ and $R_{70}$ are a hydrogen atom, an alkyl group or

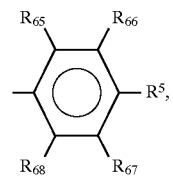

at least two of $R_5$ are —O—R$^0$—COO—C(R$^{01}$)(R$^{02}$)(R$^{03}$) and the other substituents are a hydrogen atom or a hydroxy group; and $f_2$, $q_2$, and $h_2$ are 0 or an integer of 1 to 5;

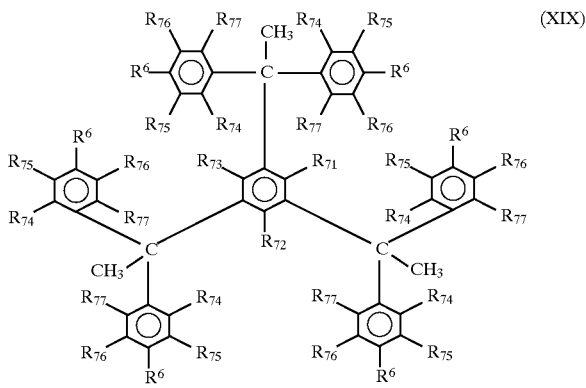

(XIX)

wherein:

$R_{71}$ to $R_{77}$ may be the same or different, and are a hydrogen atom, a hydroxy group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aryloxy group or an aralkoxy group; provided that 6 substituents represented by each of $R_{74}$ to $R_{77}$ may be the same or different; and at least two of $R_6$ are —O—$R^0$—COO—C($R^{01}$) ($R^{02}$) ($R^{03}$) and the other substituents are a hydrogen atom or a hydroxy group; and

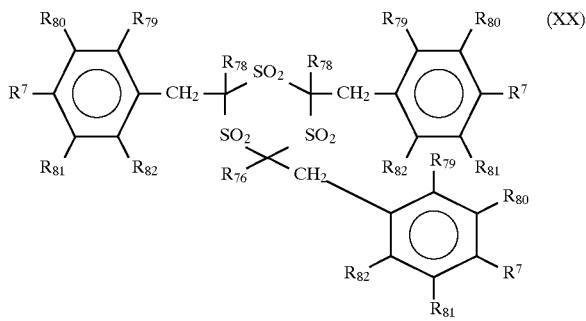

(XX)

wherein:

$R_{78}$ is a hydrogen atom or an alkyl group; provided that all the substituents may be the same or different; $R_{79}$ to $R_{82}$ are a hydrogen atom, a hydroxy group, a halogen atom, an alkyl group, or an alkoxy group; provided that each three substituents represented by the same symbol may be the same or different; and at least two of $R_7$ are —O—$R^0$—COO—C($R^{01}$) ($R^{02}$) ($R^{03}$) and the other substituents are a hydrogen atom or a hydroxy group.

2. The positive photosensitive composition of claim 1, wherein the resin (a) has a weight-average molecular weight of 1,000 to 200,000.

3. The positive photosensitive composition of claim 1, wherein the amount of the compound (b) is 0.001 to 40% by weight based on the total amount of the positive photosensitive composition excluding a solvent.

4. The positive photosensitive composition of claim 1, wherein the amount of the low molecular weight acid-decomposable dissolution inhibitor (c) is 3 to 50% by weight based on the total amount of the positive photosensitive composition excluding a solvent.

5. The positive photosensitive composition of claim 1, wherein the low molecular weight acid-decomposable dissolution inhibitor (c) has a molecular weight of 500 to 3,000.

6. A positive photosensitive composition as claimed in claim 1, wherein said resin insoluble in water and soluble in an aqueous alkali contains a structure unit represented by formula (A) and at least one structure unit represented by formula (B).

7. A positive photosensitive composition as claimed in claim 1, wherein a resin insoluble in water and soluble in an aqueous alkali solution, the resin containing a structure unit represented by formula (A) and at least one structure unit represented by formula (C).

8. A positive photosensitive composition as claimed in claim 1, wherein a resin insoluble in water and soluble in an aqueous alkali solution, the resin containing a structure unit represented by formula (A) and at least one structure unit represented by formula (D).

9. A positive photosensitive composition as claimed in claim 1, wherein a resin insoluble in water and soluble in an aqueous alkali solution, the resin containing a structure unit represented by formula (A) and at least one structure unit represented by formula (E).

10. A positive photosensitive composition as claimed in claim 1, wherein compound (c) is represented by formula (VI).

11. A positive photosensitive composition as claimed in claim 1, wherein compound (c) is represented by formula (VII).

12. A positive photosensitive composition as claimed in claim 1, wherein compound (c) is represented by formula (VIII).

13. A positive photosensitive composition as claimed in claim 1, wherein compound (c) is represented by formula (XII).

14. A positive photosensitive composition as claimed in claim 1, wherein compound (c) is represented by formula (XIII).

15. A positive photosensitive composition as claimed in claim 1, wherein compound (c) is represented by formula (XV).

16. A positive photosensitive composition as claimed in claim 1, wherein compound (c) is represented by formula (XVI).

17. A positive photosensitive composition as claimed in claim 1, wherein compound (c) is represented by formula (XVII).

18. A positive photosensitive composition as claimed in claim 1, wherein compound (c) is represented by formula (XVIII).

19. A positive photosensitive composition as claimed in claim 1, wherein compound (c) is represented by formula (XIX).

20. A positive photosensitive composition as claimed in claim 1, wherein compound (c) is represented by formula (XX).

* * * * *